US006664841B1

(12) United States Patent
Cetin et al.

(10) Patent No.: US 6,664,841 B1
(45) Date of Patent: Dec. 16, 2003

(54) METHOD AND APPARATUS FOR CONDITIONING AN ANALOG SIGNAL

(75) Inventors: Yusuf Cetin, Encinitas, CA (US); Graham S. Hamilton, San Diego, CA (US); Ibrahim G. Yayla, Encinitas, CA (US)

(73) Assignee: Conexant Systems, Inc., Newport Beach, CA (US)

( * ) Notice: Subject to any disclaimer, the term of this patent is extended or adjusted under 35 U.S.C. 154(b) by 0 days.

(21) Appl. No.: 09/816,621

(22) Filed: Mar. 23, 2001

(51) Int. Cl.[7] .............................................. H03K 5/08
(52) U.S. Cl. ........................................ 327/309; 327/74
(58) Field of Search ................................ 327/306, 309, 327/74, 72, 321, 317

(56) References Cited

U.S. PATENT DOCUMENTS 4,382,198 A  *  5/1983  Ishijima et al. ................ 327/74
5,436,824 A  *  7/1995  Royner et al. ............... 323/277

* cited by examiner

Primary Examiner—Dinh T. Le

(74) Attorney, Agent, or Firm—Procopio, Cory, Hargreaves & Savitch, LLP

(57) ABSTRACT

A novel method and apparatus for conditioning an analog signal before it is input to a downstream device such as a delta-sigma analog-to-digital converter is disclosed. An analog conditioning circuit having a reference voltage generator circuit, positive and negative voltage comparators, threshold voltage generator circuits, and a plurality of transistor gate switch limiters is disclosed. The reference voltage generator circuit generates predetermined threshold voltages against which the input signal is compared by the voltage comparators. All conditioning circuit components between the conditioning circuit input and output are electrically disconnected from the circuit when the input signal voltage does not exceed the threshold voltages, thereby minimizing signal distortion in the useful range of the input signal. When the input signal voltage meets or exceeds one of the relevant threshold voltages, the conditioning circuit components rapidly and sharply switch into the signal pathway, and the input signal is "clipped" appropriately. Transistor-based switches are used to provide rapid switching, and to reduce power that is consumed by the circuit when no clipping of the input signal is required. An integrated circuit including the aforementioned conditioning circuit and a delta-sigma analog-to-digital converter, and an electronic device incorporating the integrated circuit, are also disclosed.

16 Claims, 16 Drawing Sheets

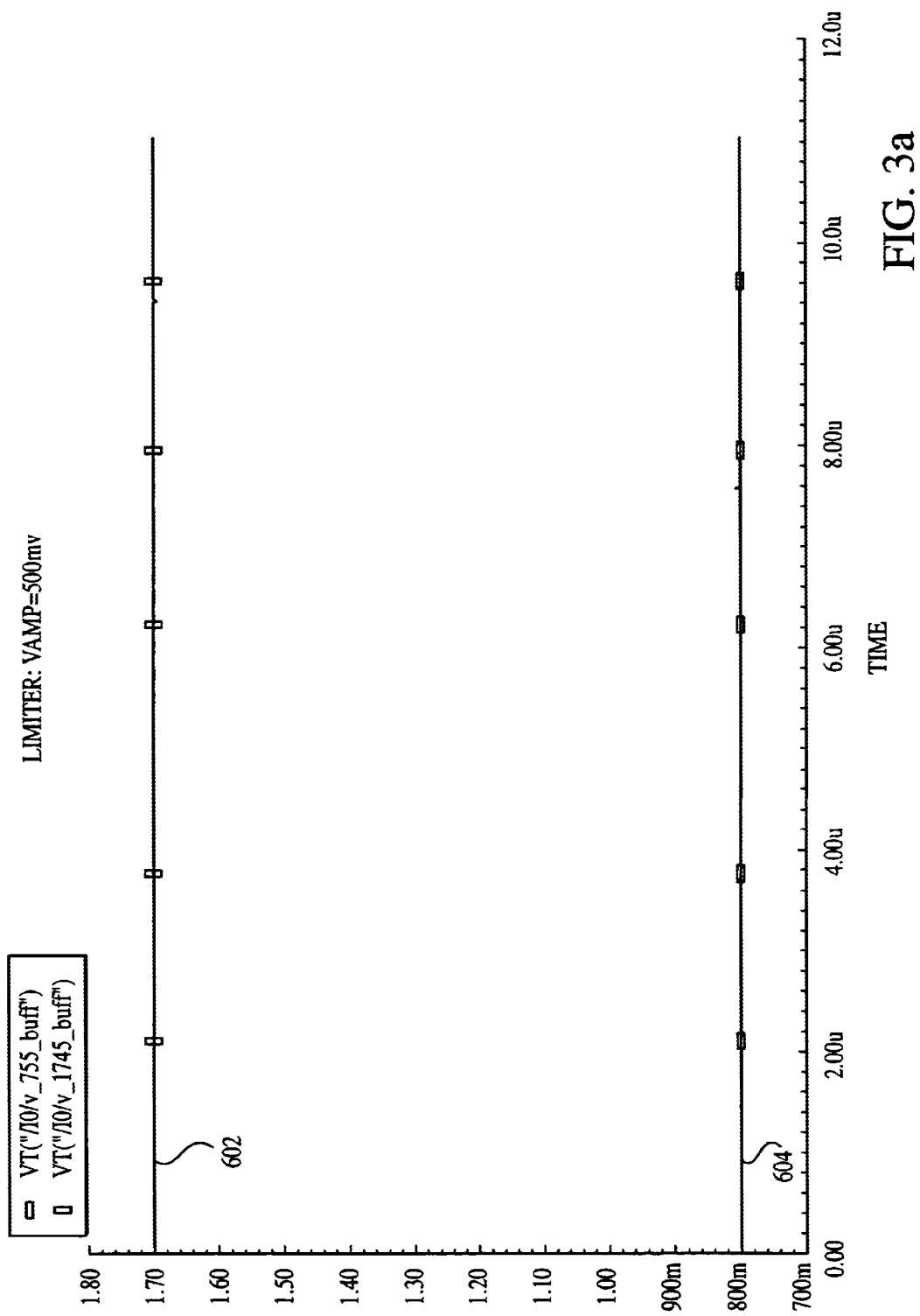

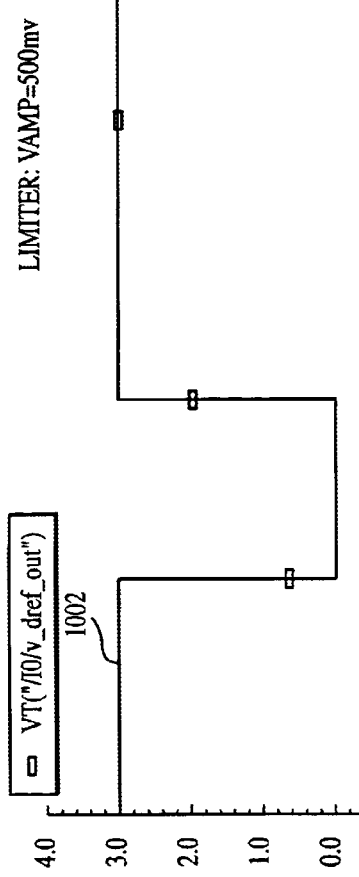
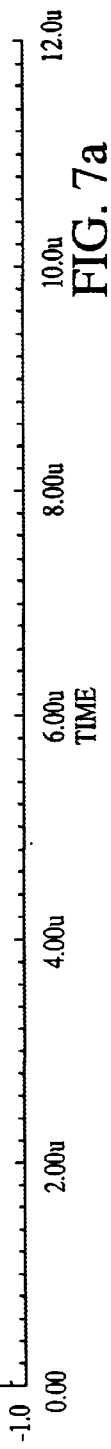
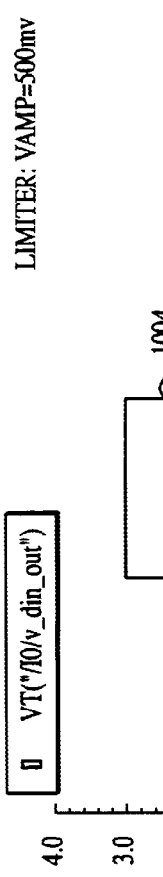
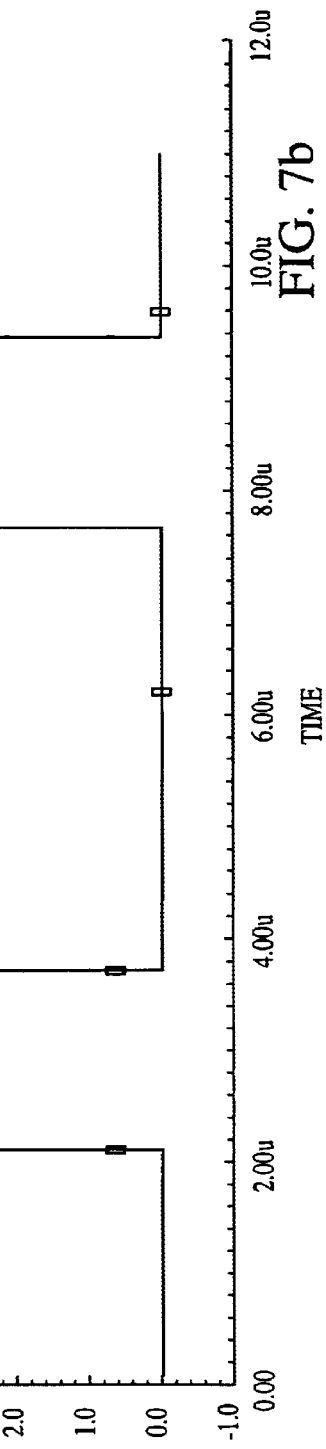
FIG. 7a
FIG. 7b

METHOD AND APPARATUS FOR CONDITIONING AN ANALOG SIGNAL

BACKGROUND OF THE INVENTION

1. Field of the Invention

This invention relates generally to methods and apparatus for conditioning an analog input signal, and specifically to limiting or "clipping" an analog signal that is input to an analog-to-digital converter, the input signal being variant in voltage with time.

2. Description of Related Art

Analog circuits are commonly used to condition signals supplied to or received from other devices or functional units within an integrated device. For example, an analog circuit is often used as a "front end" signal conditioner for an analog-to-digital converter (ADC) implemented in the form of an application-specific integrated circuit (ASIC), the ADC converting the conditioned analog signal to a binary digital format for use by digital circuitry either within or external to the ASIC. In the case of an ADC, it is often necessary to condition the analog input signal in order to obtain improved or even acceptable performance from the ADC, as described in greater detail below. While the following exemplary discussion is cast in terms of an ADC/ASIC, those skilled in electronic art shall appreciate that analog signal conditioning may be utilized in a broad range of electronic applications.

Analog-to-digital converters are well known in the electronic arts. ADC devices take an analog input signal of varying voltage and convert it to a binary digital representation of the input signal for subsequent processing by digital circuitry such as a digital signal processor (DSP). ADC devices can generally be divided into different functional categories, including "over-sampling" ADC devices. Over-sampling converters, as the name implies, sample the analog signal at a frequency that is typically much higher than the Nyquist frequency. The delta-sigma converter (also referred to as a "sigma-delta" converter) is one type of over-sampling converter that is commonly used in applications where the high sampling rate provides intrinsic benefits. Such applications include digital audio and video decoding. As is well known, Delta modulation refers generally to the process whereby the digital output signal represents the change, or "delta", of the analog input signal. Delta-sigma converters integrate the analog input signal before performing delta modulation. Hence, the integral of the analog input signal is encoded in delta sigma converters. In contrast, only the delta or change in the input signal is encoded in the simple delta modulator. A digital sample rate reduction filter (commonly known as a decimation filter) is also commonly used to provide an output sampling rate that differs from the Nyquist frequency of the signal. The combination of the over-sampling process and the decimation process produces greater resolution than a typical Nyquist converter.

Third order and higher order delta-sigma converters, in contrast to their lower-order counterparts, provide enhanced performance due to their ability to more effectively remove in-band noise from the signal. Hence, a third-order or higher order delta-sigma converter will provide a higher quality digital audio or video signal (i.e., higher Signal-to-Noise Ratios (SNR)) than second-order or lower order counterparts.

Despite their enhanced performance and utility in certain applications, all third order (and higher order) delta sigma converters are inherently unstable. This instability arises from, inter alia, the noise transfer function (NTF) associated with the converter. Typically, this instability is manifested in very harsh and largely unpredictable signal degradation when the relevant threshold condition (ie., input signal voltage) is exceeded. Throughout the remainder of this specification the term "exceed" or "exceeds" is used to describe the condition when the input signal voltage level is either greater than a high threshold voltage or less than a low threshold voltage.

Unlike other types of circuits that may exhibit more "graceful" degradation (e.g., a progressively increasing noise component or distortion present in the output signal) as the threshold voltage is exceeded, third and higher order delta-sigma converters tend to degrade catastrophically. Even small increases in the input voltage above a threshold induce large oscillations within the circuit. This results in an output signal that is almost entirely dominated by noise, and that bears little or no resemblance to the input signal. This type of behavior is especially troubling in applications in which it is desirable to have improved control over the degradation of the output signal, such as in digital audio applications.

Consider, for example, the use of a third-order or higher order delta-sigma ADC in a digital wireless telephone wherein there are no limitations placed on the input signal that is applied to the ADC. When a caller's audio input produces input voltages that are less than the specified threshold value, the noise component within the output signal of the ADC is minimized, and the useful signal is maximized. However, when the input signal exceeds a level that induces oscillation of the converter, there is a rapid and often complete degradation of the signal. In such cases, a very abrupt cessation of voice may become manifest and perceived by the listener. This cessation may be followed by an unintelligible string of voice information until the signal level falls very near or below the threshold value of the ADC. Clearly such circuit behavior is unacceptable and must be avoided.

While third-order and higher-order converters can be made conditionally stable by appropriately restricting the input signal voltage or via system level design, such design and operational restrictions place a significant burden on the system designer. This is highly undesirable from the perspective of labor and man-hours required to implement the restrictions, thereby potentially increasing required die area, external component costs and time-to-market of devices using delta-sigma converters. In many applications, such design restrictions are exceedingly difficult to implement, such as in the case of a tuner circuit whose output (ie., the input to the ADC) may vary hundreds of millivolts. Furthermore, prior art approaches for restricting voltages that are provided as input to the ADC can have significant deleterious effects on the quality and useful range of the input signal.

Some techniques for restricting or conditioning voltages of an analog signal that is input to another device, such as a higher-order ADC, have been proposed in the prior art. These techniques typically require that the input signal voltage be progressively restricted as it approaches a threshold value of interest. For example, one approach utilizes discrete components, such as diodes, to "clip" an input voltage as it approaches a pre-determined threshold voltage. The degree of signal clipping is substantially dependent upon the proximity of the input signal voltage to the pre-determined threshold. At a voltage that is substantially distant from the threshold voltage, there will be very little if any clipping of the input signal. However, as the input signal voltage approaches the threshold voltage, more clipping is applied until the input signal is completely clipped so as to maintain its voltage at or below the threshold level. When completely clipped in this fashion, no amount of increase in the input signal voltage will drive the output voltage to a level that is higher than the threshold voltage.

While effective at clipping the signal so as to avoid exceeding the threshold, the foregoing technique suffers from the significant disadvantage of distorting the input signal when it operates within the voltage range of interest. The degree of signal distortion varies depending on the proximity of the voltage to the threshold. The diodes used by the previous clipping techniques create increased signal distortion as the voltage thresholds are approached. At some point the distortion becomes sufficiently significant such that the resultant signal is no longer useful. At this point, the ADC device range that causes oscillation may not be reached. Hence, if the useful range of voltages for the unclipped signal is limited (as limited by the design goal of avoiding oscillations within the higher-order delta sigma ADC), the useful range of the progressively "clipped" signal is also limited. The useful range of the signal is therefore disadvantageously unnecessarily restricted by the prior art progressive clipping approach.

In addition to distorting the input signal in the regions adjacent to the voltage thresholds, the prior art techniques also distort the input signal throughout its entire useful range. This latter distortion stems from the fact that the diodes (or other components that are used to clip or condition the signal) are always maintained directly in the signal path between the input and the receiving device (e.g., ADC). Even when no clipping occurs, the analog input signal is somewhat distorted because the signal is always passed through the diodes.

In addition to efficiently and noiselessly clipping or conditioning an input signal, it is also desirable to minimize power that is consumed by the signal conditioning circuitry. Benefits of reduced power consumption include, inter alia, increased power source longevity (such as batteries used in a portable device), and reduced heat generation. Power is consumed within integrated circuits by a variety of different components and the operations performed by those components. In many analog circuit designs, some minimal current flow must always be provided to the components of the circuit (such as operational amplifiers) in order to maintain the components and circuit in a desired operational state. This current flow is required even when the circuit or portions thereof are not in use. Such indiscriminant current flow increases the power consumption of the circuit and its integrated circuit, which is highly undesirable. Therefore, it is desirable to provide a signal conditioning apparatus that not only reduces signal distortion, but also reduces the power consumed by circuit components, especially when the signal conditioning apparatus is not actively clipping the input signal.

Based on the foregoing, an improved method and apparatus for conditioning an analog signal that is subsequently input to downstream devices, such as higher order delta-sigma ADCs, is desired. Such an improved method and apparatus should maximize the useful range of the input signal consistent with the limitations of the downstream device, while also mitigating or eliminating distortion of the signal within the useful range. Such an improved method and apparatus should be implemented so as to consume a minimum amount of power necessary for operation, thereby increasing power efficiencies and reducing heat generation associated thereto. Lastly, the improved method and apparatus should also ideally be capable of being implemented in silicon, so as to facilitate use within an integrated circuit (IC) such as an ASIC.

SUMMARY OF THE INVENTION

The present invention satisfies the aforementioned needs by providing an improved method and apparatus for conditioning an analog input signal for use by downstream devices.

In one exemplary embodiment, the apparatus comprises an analog conditioning circuit having (a) a reference voltage generator circuit; (b) voltage comparators; (c) threshold voltage generator circuits; and (d) a plurality of transistor gate switch limiters. The reference voltage generator circuit generates both low and high threshold voltages using a voltage divider network. The voltage of the input signal is compared against the threshold voltages. Comparison of the input signal to the threshold voltages is performed by the voltage comparators. When the input signal voltage is either greater than the low threshold voltage, or less than high threshold voltage (i.e., when the input operates within the desired dynamic operating range and therefore does not "exceed" either of the threshold voltages), all conditioning circuit components are effectively removed from the circuit by the switch limiters. In this mode of operation, the conditioning circuit is transparent to the input signal, and advantageously no distortion of the input signal occurs within the dynamic range of operation. However, when the input signal meets or exceeds one of the threshold voltages (i.e., when the input signal is either equal to or less then the low threshold voltage, or equal to or greater than the high threshold), the conditioning circuit components are placed in the signal pathway by the switch limiters and are thereby used to "clip" the input signal.

Specifically, when the present inventive signal conditioning apparatus is in a "clipping" mode of operation, the output of the threshold voltage generator exceeded by the input signal is applied to the output of the conditioning circuit. The resulting output signal therefore never exceeds the relevant threshold voltage, and the input signal is thereby appropriately "clipped". The conditioning circuit is designed such that a very rapid transition between the unclipped and clipped states is provided, thereby effectively eliminating distortion of the input signal within the dynamic range of operation. This transition is effected in part by using MOSFET-based transistor gates within the switch limiters.

An improved method of conditioning an analog signal is also disclosed. The method generally comprises the steps of providing an analog signal whose voltage varies as a function of time; defining at least one voltage threshold for the analog signal; monitoring the relationship of the analog signal with respect to the voltage threshold; and selectively inserting at least one voltage conditioning component in the signal path of the analog signal to effect the signal conditioning desired. In one exemplary embodiment, the method is applied using the inventive analog conditioning circuit to clip the analog signal before it is input to a high-order delta-sigma ADC. Two thresholds are defined for the signal (i.e., upper and lower voltage thresholds), corresponding generally to the upper and lower dynamic range limits of the ADC. As the input signal voltage approaches either one of the thresholds, the signal is clipped sharply by changing the state of the switch limiters within the conditioning circuit. The change in state of the switch limiters applies the output of the threshold voltage generators (specifically, the output of the threshold generator associated with the threshold that was exceeded by the input signal) to the output of the conditioning circuit (and therefore the input of the ADC). The ADC is thereby prevented from oscillating yet the quality of the input signal is preserved within the dynamic range.

The improved method and apparatus for conditioning an analog signal also reduces power consumption of an analog signal conditioning circuit when signal conditioning is not required. In one exemplary embodiment, the relationship between the analog input signal and the threshold values is determined using voltage comparators that control the operation of the conditioning circuit. When a threshold voltage is exceeded, the comparators generate a signal that results in the introduction of clipped signals into the signal path and ultimately to the output of the conditioning circuit. During periods when the input signal operates below the predetermined thresholds, certain components within the conditioning circuit are rendered effectively inactive using parallel current sources that reduce the current draw (and power consumption) of these components. During these "inactive" periods, only a minimal amount of current is provided to reference voltage generators of the conditioning circuit. When the input signal exceeds one of the references thresholds voltages, the current sources provide full power to the reference voltage generators. Power is thereby conserved in the present inventive conditioning circuit when clipping is not required.

BRIEF DESCRIPTION OF THE DRAWINGS

FIG. 3a is a graph showing high and low threshold voltages generated by the threshold generator circuits of the embodiment shown in FIG. 2.

FIG. 7a is a graph illustrating the output voltage ("v_dref_out") of the NOR gate of the signal conditioning circuit of FIG. 2, as a function of time.

FIG. 7b is a graph illustrating the output voltage ("v_din_out") of the inverter of the signal conditioning circuit of FIG. 2, as a function of time.

Like reference numbers and designations in the various drawings indicate like elements.

DETAILED DESCRIPTION OF THE INVENTION

Throughout this description, the preferred embodiment and examples shown should be considered as exemplars, rather than as limitations on the present invention.

Exemplary Signal Conditioning Circuit

Figure 1:
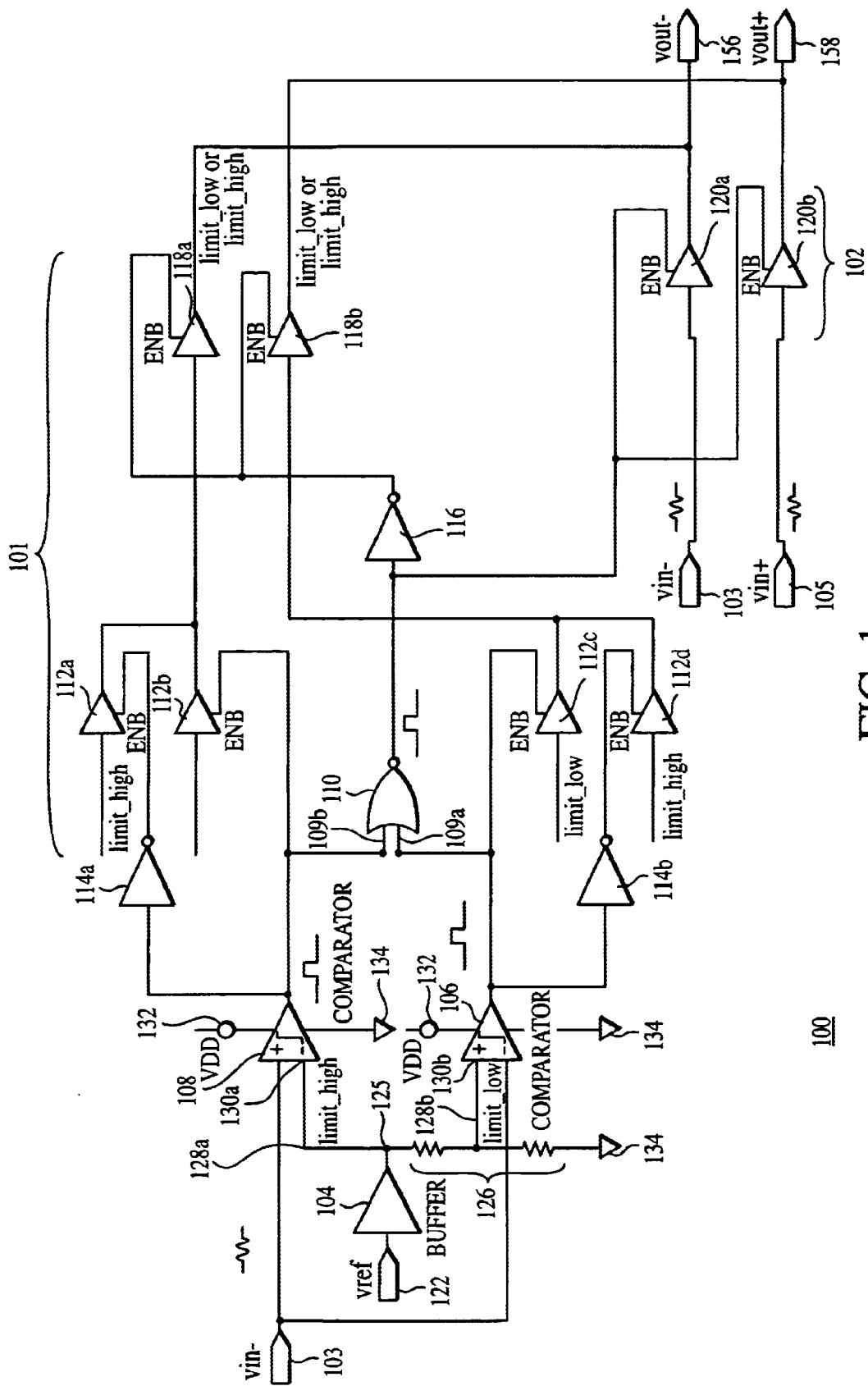
FIG. 1 is a schematic of a first exemplary embodiment of a signal conditioning circuit in accordance with the present invention.

One exemplary embodiment of the signal conditioning apparatus of the present invention is described now with reference to FIG. 1. The inventive apparatus comprises a plurality of circuit elements arranged into a limiter circuit 100 including a clipping portion 101 and a non-clipping portion 102. As will be described in detail below, the clipping portion 101 and the non-clipping portion 102 are selectively used to condition the analog input signal as required. Specifically, the limiter circuit 100 comprises a reference signal buffer 104, a "limit low" comparator 106, a "limit high" comparator 108, a NOR gate 110, a series of clipping tri-state buffers 112a–d, two inverters 114a, 114b, an inverting buffer 116, a pair of output non-inverting tri-state buffers 118a, 118b, and a pair of "pass-through" non-inverting tri-state buffers 120a, 120b. A reference voltage signal ("vref") 122 is input to the non-inverting reference signal buffer 104 whose output 125 is connected to a voltage divider network 126. The voltage divider network 126 is operatively coupled to the inputs of the comparators 106, 108 as shown in FIG. 1.

The "high" and "low" voltage nodes 128a, 128b, respectively, of the voltage divider network 126 are input to respective and associated inputs 130a, 130b of the respective comparators 108, 106. In this configuration, the limit low comparator 106 is used to detect voltage conditions of vin− (on the input 103) with respect to a low voltage threshold value. The limit high comparator 108 is used to detect input voltage conditions with respect to a high voltage threshold. It will be recognized that while two limit comparators 106, 108, and a voltage divider network 126 are used in the embodiment of FIG. 1 to detect the low and high voltage conditions, other arrangements may be used with equal success. For example, in an alternative embodiment of the present invention, the low and high voltage threshold signals may be directly provided by an external voltage generator.

Each of the limit comparators 106, 108 of the circuit 100 connected to a known voltage source ("vdd") 132 as well as a ground potential 134 in order to facilitate their operation, as is well known in the electrical art. Alternatively, the limit comparators may comprise as a sub-component or sub-circuit of an integrated circuit device such as an Application Specific Integrated Circuit ("ASIC").

The outputs of the limit comparators 106, 108 are input to a variety of other components within the limiter circuit 100, as is now described. First, the output of each limit comparator 106, 108 is input to respective inputs 109a, 109b of the NOR gate 110. The output of the NOR gate 110 is used to control the switching of the clipping portion 101 and non-clipping portion 102 of the limiter circuit 100 as described in more detail below. The outputs of the comparators 106, 108 are also used to control the enable controls of the clipping tri-state buffers 112a–d. As shown in FIG. 1, the output of comparator 106 controls the enable control ("ENS") of the buffer 112c. The same comparator output is inverted (by the inverter 114b) and coupled to the enable control of the tri-state buffer 112d. The output of the comparator 108 is similarly coupled to the tri-state buffers 112a and 112b.

The outputs of the buffer pairs (i.e., the buffers 112a and 112b comprising a first pair, and buffers 112c and 112d comprising a second pair) are input to respective and associated clipping portion tri-state buffers 118a, 118b as shown in FIG. 1. The enable control of the clipping portion tri-state buffers 118a, 118b is controlled by the output of the NOR gate 110. The outputs of the two clipping portion buffers 118a, 118b are connected to respective ones of the output terminals of the circuit "vout−" 156, and "vout+" 158, thereby completing the "clipping" portion 101 of the limiter circuit 100.

Referring again to FIG. 1, when the input signal "vin−" as applied to the input terminal 103, falls within a prescribed range of threshold voltage levels (as determined by the reference voltage "vref" 122), the limit comparators 106, 108 output logical "low" or zero values. The logical zeros are provided as inputs to the NOR gate 110 (at respective inputs 109a, 109b). The logic or "truth" table of the NOR gate 110 is well known in the art and therefore is not described herein. When the input voltage "vin−" at the input terminal 103 falls within the predetermined threshold range, the NOR gate 110 outputs a logical one or "high" value. However, should the input voltage either exceed (i.e., fall below) the "limit-low" threshold (at the comparator input 130b), or exceed the "limit-high" threshold (at the comparator input 130a), a logical one (or "high") value is presented at an input (either 109a or 109b) of the NOR gate 110. In either case, the NOR gate 110 generates a logical low signal and thereby enables the clipping portion tri-state buffers 118a, 118b.

When clipping of the input signal is not needed, the NOR gate 110 generates a logic "high" (corresponding to when the input signal vin− falls within the prescribed voltage threshold). This same logic high signal is applied to the enable control terminals of the pass-through tri-state buffers 120a, 120b, thereby allowing the input signal applied to the circuit input terminals 103, 105 to be passed through the buffers 120a, 120b to the output terminals 156, 158. In this fashion, the clipping portion 101 of the circuit 100 is electrically transparent when clipping of the input signal is not required. This approach advantageously removes essentially all components from the signal path during non-clipping operation of the limiter 100, thereby eliminating noise or distortion that might otherwise be produced.

When clipping of the input signal is needed, which occurs when the voltage of the input signal meets or exceeds the specified threshold voltages, the output of one of the comparators 106, 108 is forced "high", thereby producing a logic "low" at the output of the NOR gate 110. This logic "low" disables the pass-through tri-state buffers 120a, 120b. At the same time, the tri-state buffers 118a, 118b are enable so that the clipped signal is passed from the output of the clipping tri-state buffers 112a–d through the clipping portion buffers 118a, 118b to the output terminals 156, 158. The limiter circuit 100 advantageously provides a very rapid transition from the non-clipped state to the clipped state (i.e., the difference in voltage between the non-clipped and clipped states is very small in proportion to the amplitude of the input signal). The rapid transition from the clipped to non-clipped states is achieved in the present limiter by the operation of the comparators and the tri-state buffers, and by the electrical properties of these components in isolation. This rapid transition provides a significant benefit in that the distortion of the input signal in the non-clipped region is significantly mitigated. The present limiter circuit thereby effectively operates in a "digital" fashion, i.e., either in the clipped or non-clipped states.

Figure 2:
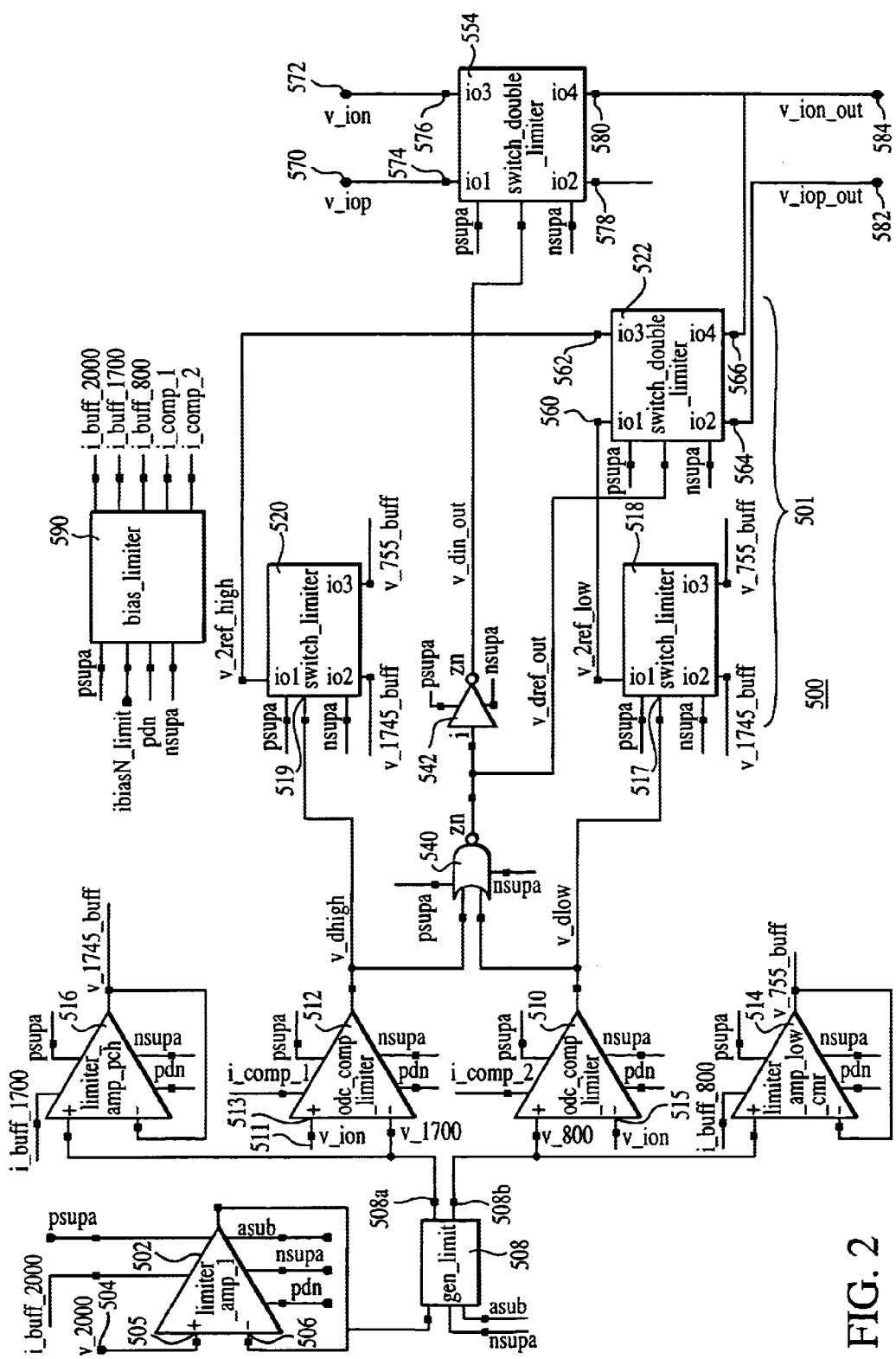
FIG. 2 is a detailed schematic illustrating a second exemplary embodiment of the signal conditioning circuit of the present invention.

Referring now to FIG. 2, a second embodiment of the signal conditioning apparatus of the present invention is described. The embodiment of the limiter circuit 500 shown in FIG. 2 includes an input limiter amplifier 502 which receives an input signal 504 at its positive terminal 505. In the embodiment shown, an input reference signal of 2000 millivolts ("v_2000") is input to the amplifier 502, although it will be recognized that other reference voltages, whether positive or negative, may be used with the present invention. The output of the amplifier 502 is fed back to the negative input terminal 506 to create an electronic buffer, as is well known in the electronic art. The output of the amplifier 502 is also provided as input to a voltage generator circuit 508. The voltage generator 508 generates two reference voltages at its outputs 508a, 508b. The reference voltages are provided as input to two comparators 510, 512 and to two clipping signal buffers 514, 516. Specifically, in the embodiment shown in FIG. 2, these two reference voltage values comprise voltages of approximately 1700 millivolts (output 508a) and 800 millivolts (output 508b), respectively, and are used to generate the voltage threshold values 602, 604 shown in FIG. 3a. It will be appreciated that other threshold voltage values may be used, or alternatively only one threshold voltage may be used to practice the present invention. The threshold voltages 602, 604 of FIG. 3a are effectively constant over time. However, it will be recognized that the apparatus 500 of FIG. 2 may be configured such that the threshold values 602, 604 vary as a function of time.

Figure 3B:
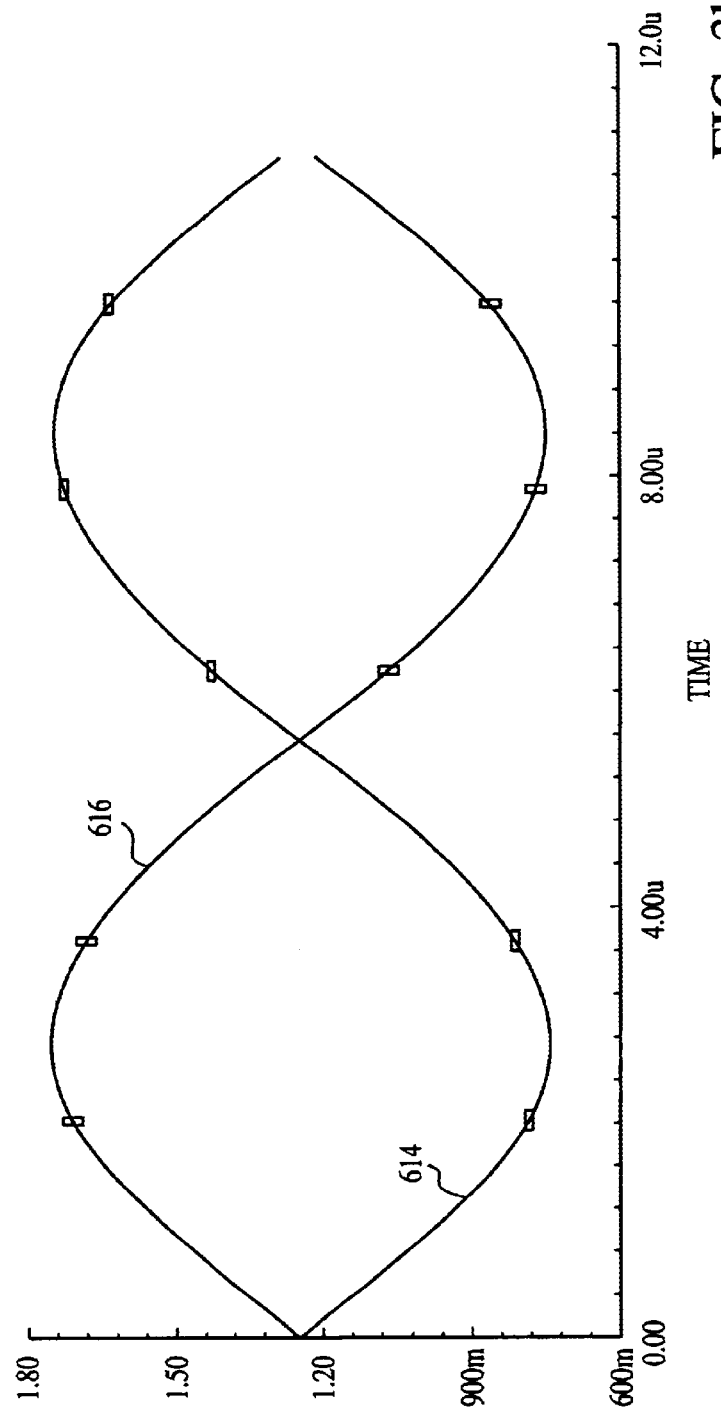
FIG. 3b is a graph showing the relationship between the voltage of the positive and negative input signals, "vip1" and "vin1", used in conjunction with the circuit of FIG. 2.
Figure 3C:
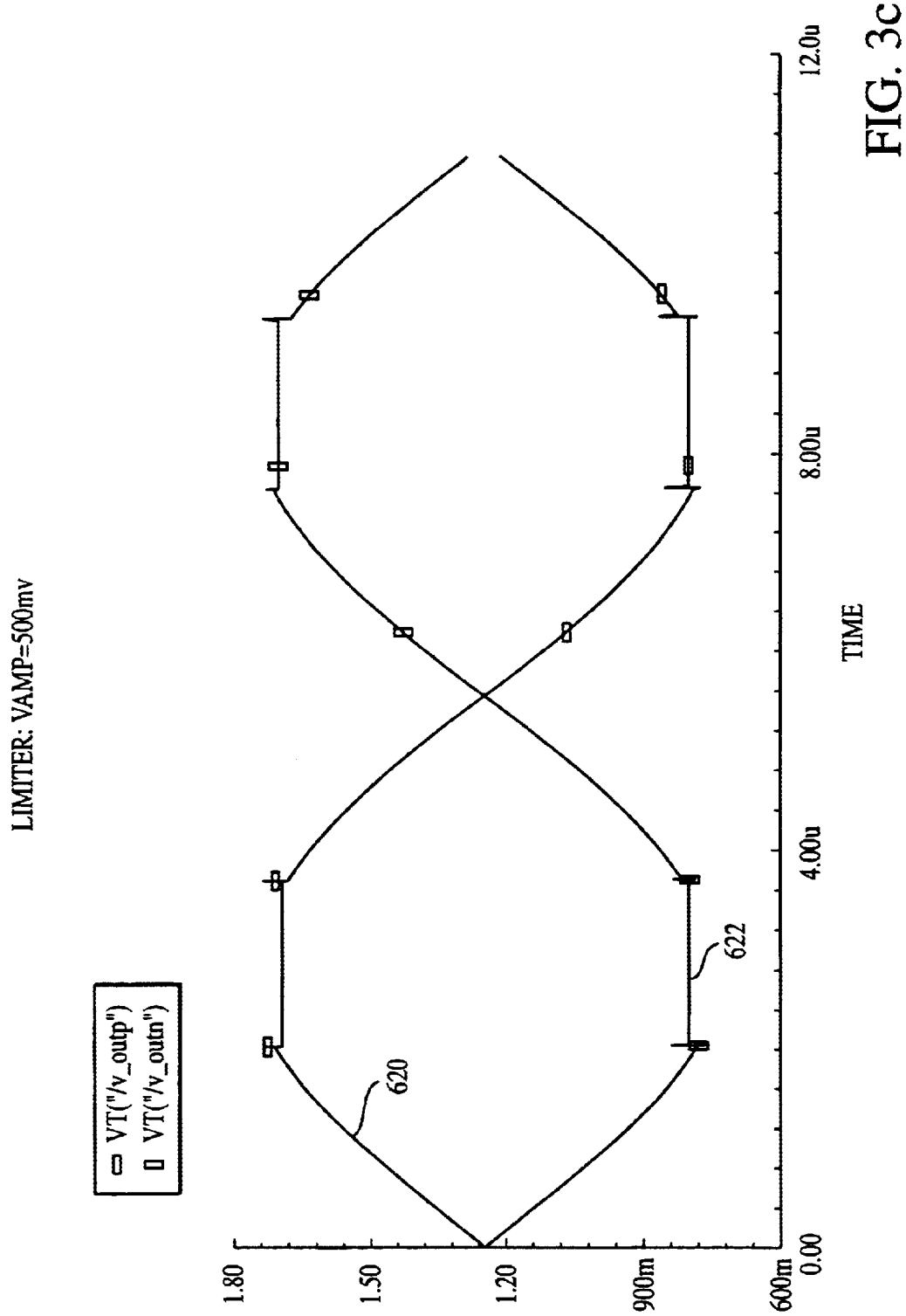
FIG. 3c is a graph showing the voltage of the "clipped" positive and negative output signals, "v_outp" and "v_outn", corresponding to the positive and negative input signals vip1 and vin1 of FIG. 3b, as a function of time.
Figure 3D:
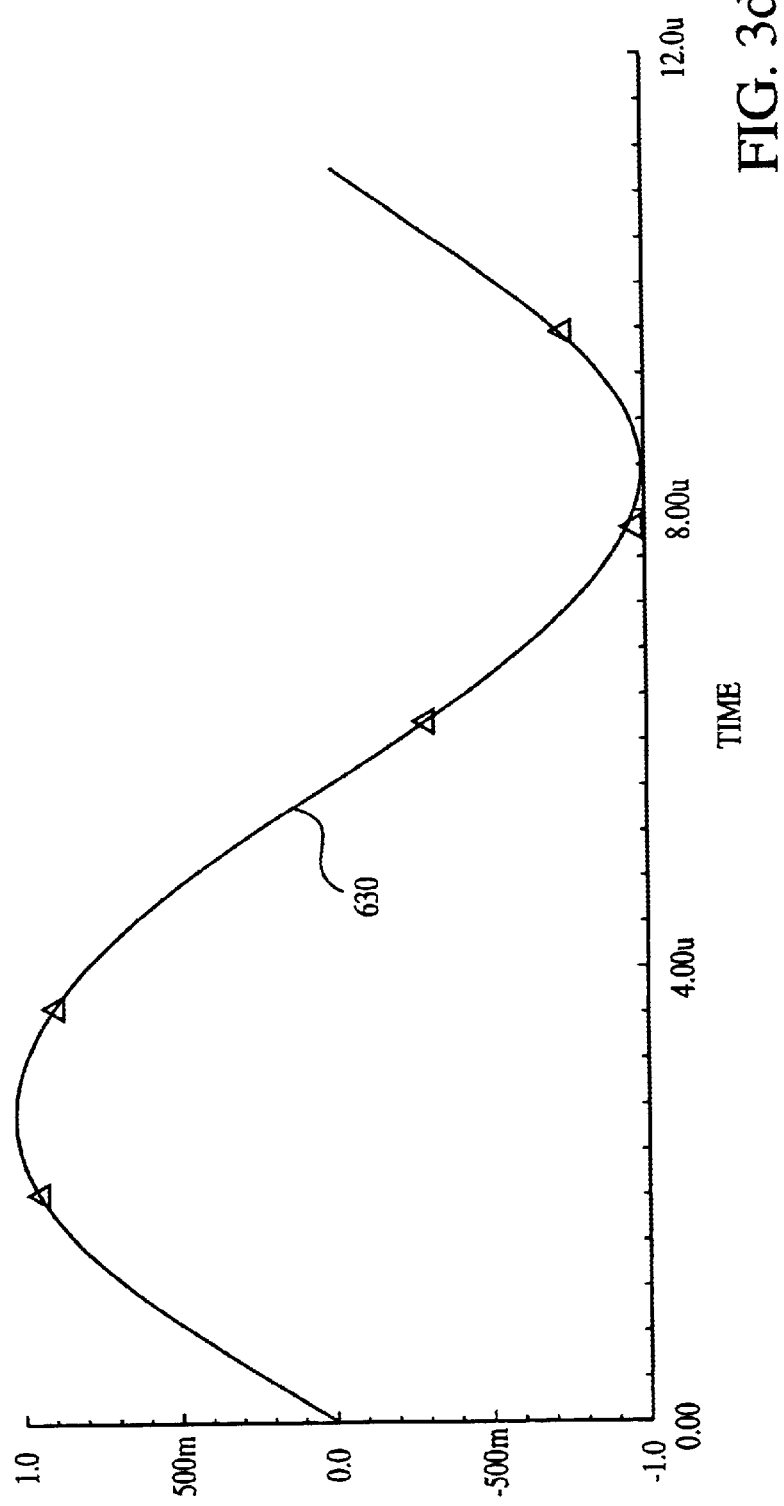
FIG. 3d is a graph showing the voltage of the un-clipped differential voltage waveform ("vip1"—"vin1") as a function of time.

FIG. 3b illustrates the relationship between two differential input signals, "vip1" 616, and "vin1" 614, which are shifted in phase as shown. The input signal ("v_ion") is input to the comparators 510, 512, specifically at the positive input "vip" 513 of comparator 512 and at the negative input terminal "vin" 515 of the comparator 510. FIG. 3c illustrates the "clipped" output signals v_outp 620 and v_outn 622 corresponding to the input signals 616, 614 of FIG. 3b. As shown in FIG. 3c, the output waveforms 620, 622 are each clipped at voltages above the high threshold value and below the low threshold value shown in FIG. 3a. FIG. 3d represents a plot of the un-clipped differential voltage waveform 630 (i.e., "vip1 " minus "vin1") as a function of time.

Figure 3E:
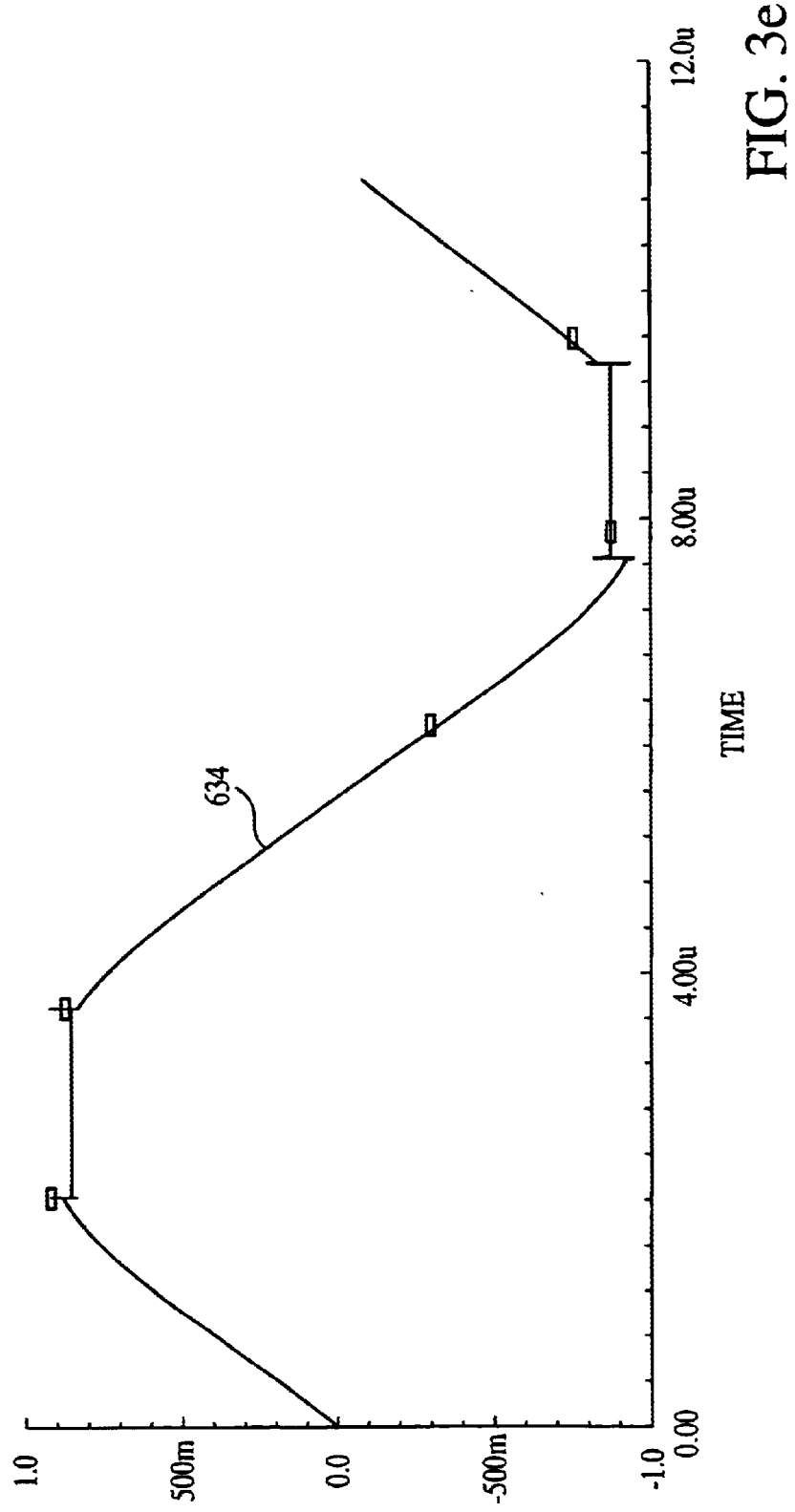
FIG. 3e is a graph showing a clipped output signal resulting from clipping the differential voltage waveform of FIG. 3d.

FIG. 3e illustrates a clipped differential waveform 634 that results from the clipped waveforms 620, 622 of FIG. 3c. Note that the clipped differential waveform 634 of FIG. 3e operates between approximately +900 millivolts and −900 millivolts, in contrast to the waveforms of FIG. 3c. FIG. 3e represents the arithmetic subtraction of the waveforms of FIG. 3c.

Referring again to the limiter circuit of FIG. 2, the comparators 510, 512 compare the reference voltage signals previously described to the input signal (v_ion) at an input node 511. The input signal V_ion 511 is input to the positive input terminal 513 of the first comparator 512 and the negative input terminal 515 of the second comparator 510. In this fashion, the first comparator 512 is used to determine the proximity of the input signal v_ion to the high reference voltage threshold, while the second comparator 510 is used to determine the proximity of the input signal 511 to the low voltage threshold.

Figure 4:
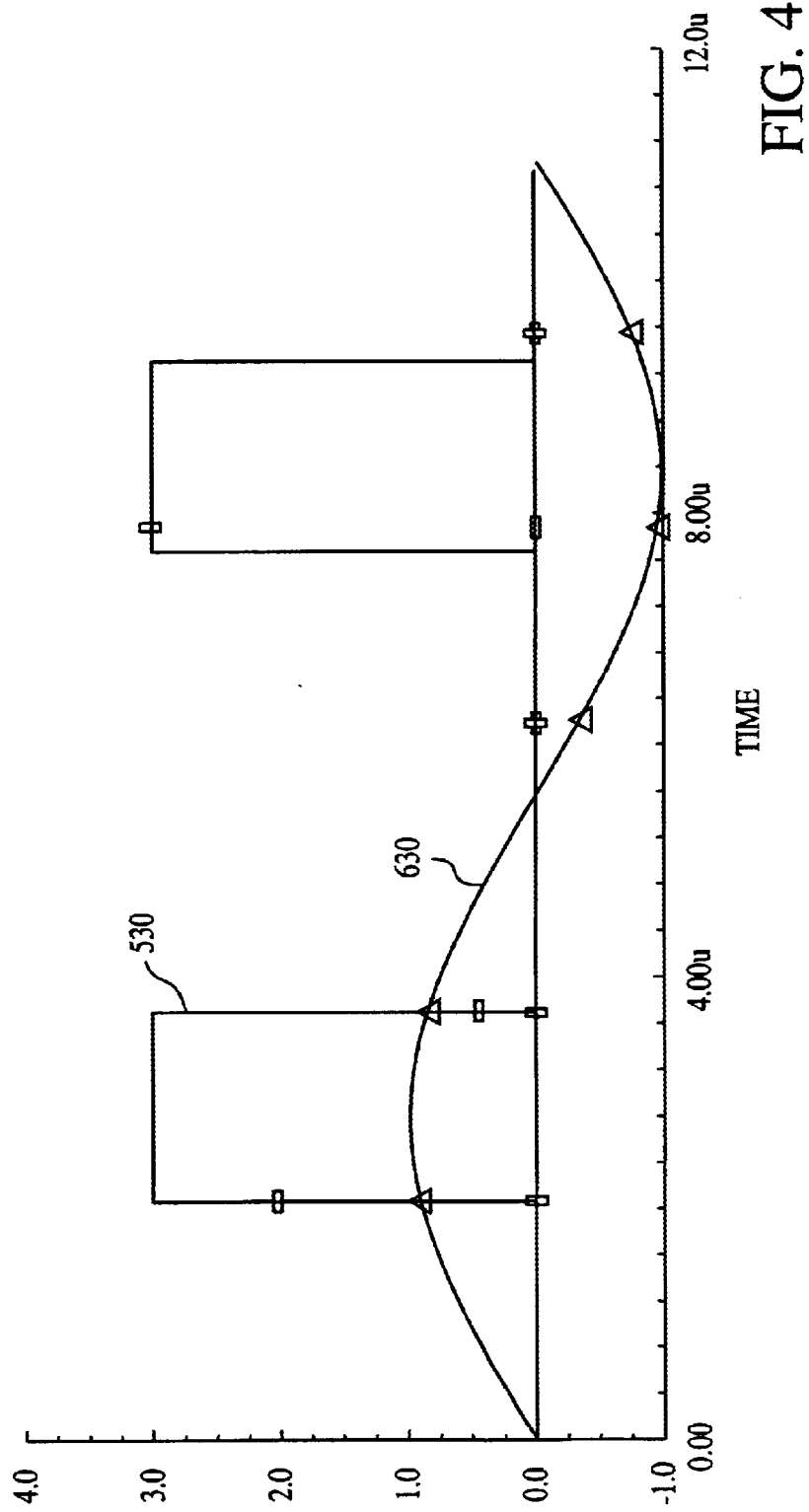
FIG. 4 is a graph illustrating the output signal of the comparators of the circuit of FIG. 2 as a function of time.

FIG. 4 shows the output of the comparators 510, 512 as a function of time, in relation to the unclipped differential waveform 630 of FIG. 3d. During a period when the input waveform voltage v_ion (not shown) meets or exceeds the lower voltage threshold, the value of an output 530 (v_dlow) of the second comparator 510 is driven high, thereby asserting an enable signal at an enable control pin 517 of a second switch limiter device 518. Conversely, the output (v_dhigh) of the first comparator 512 remains at approximately zero volts, thereby not enabling a first switch limiter 520. When the high threshold voltage is exceeded, an inverse state occurs; i.e., the first comparator output 512 is driven high and enables the first switch limiter 520, while the second limiter 518 remains disabled.

Referring again to FIG. 2, the two clipping signal buffers 514, 516 comprise operational amplifiers having outputs coupled to respective negative input terminals of the buffers as described above. In accordance with the present invention, the limiter 500 of FIG. 2 is designed such that power to the operational amplifiers 514, 516 is conserved when the input voltage falls between the low and high threshold voltages (i.e., when no clipping of the input voltage is required). Full power is provided to the operational amplifiers 514, 516 only when the input voltage exceeds one of the threshold voltages, otherwise, only minimal operating current is provided to the operational amplifiers 514, 516. In this manner, the limiter 500 conserves the power consumed by the operational amplifiers 514, 516 during non-clipping modes of operation.

More specifically, when the input voltage operates between the threshold voltages (i.e., between the low an high threshold voltages) parallel current sources (not shown) provide a minimal amount of current to the amplifiers 514, 516. In this mode, the parallel current sources generate the minimal amount of current necessary to maintain internal nodes of the operational amplifiers 514, 516 at levels that are relatively close to levels that they will attain when the input current eventually exceeds one of the voltage thresholds (i.e., when the limiter 500 enters a clipping mode of operation). In this manner, the time necessary to charge/discharge the internal nodes of the operational amplifiers 514, 516 when the limiter changes from a non-clipping to a clipping mode of operation, or vice versa, is reduced. When the input signal exceeds one of the thresholds, the current sources increase the current required to push the operational amplifiers 514, 516 into a full-power mode of operation. The operational amplifiers 514, 516, then generate the high and low threshold voltages at their respective outputs. These threshold voltages are provided as inputs to other components of the limiter 500 of FIG. 2.

It will be recognized that other types of buffer arrangements may be substituted without departing from the spirit or scope of the present invention. The output waveforms of both clipping signal buffers 514, 516 are provided as inputs to each of the two switch limiter devices 518, 520, described in detail below with respect to FIG. 5. Specifically, the clipping signal buffers 514, 516 respectively generate "clipped" high and low voltage signals that are applied to output terminals of the circuit 500 during periods when the input signal exceeds the high or low thresholds, respectively.

Figure 5:
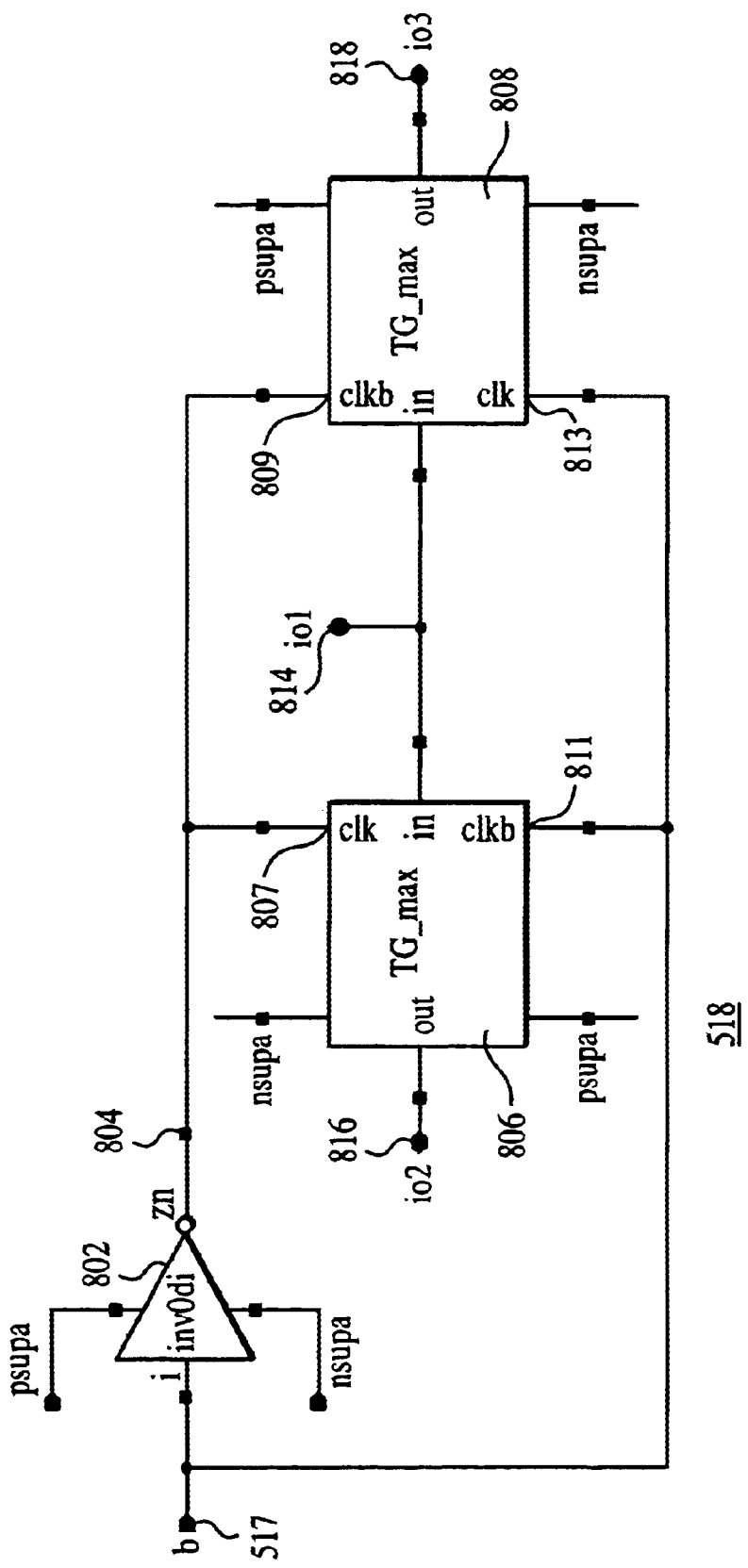
FIG. 5 is a schematic diagram illustrating one exemplary embodiment of a switch limiter device used to implement the signal conditioning circuit of FIG. 2.

Referring now to FIG. 5, the construction and operation of the switch limiters 518, 520 of the embodiment 500 of FIG. 2 are described in more detail. The switch limiters 518, 520 effectively act as "two-to-one" multiplexers, with one of two inputs (i.e., those generated by the clipping signal buffers 514, 516) being switched to the output. The buffer 516 outputs the high threshold voltage "v_1745_buff", while the buffer 514 outputs the low threshold voltage "V_755_buff". When clipping is enabled, the appropriate threshold voltage (i.e., the threshold that is exceeded by the input) is routed through the switch limiters, and output to the limiter outputs.

As shown in FIG. 5, the switch limiters 518, 520 each comprise an inverter 802 coupled to an enable terminal 517 (or 519). An output 804 of the inverter 802 is input to a first transistor gate device 806 via a clock (clk) terminal 807, and a second gate device 808 via a clock complement (clkb) terminal 809. Similarly, the enable input terminal 517 (or 519) is coupled to the clock complement (clkb) terminal 811 of the first gate device 806, and to the clock (clk) terminal 813 of the second gate device 808. A common output terminal 814 is utilized for both gate devices 806, 808, while separate input terminals 816 and 818 are used for the first and second devices, respectively. The gate devices 806, 808 and inverter are used to route one, and only one of the input terminals to the output terminal 814.

When a logic "high" is placed at the enable input terminal 517, the same signal is applied to the clkb terminal 811 of the first gate device, and the clk terminal of the 813 of the second gate device. That same signal is also inverted by the inverter 802 to a logic "low", and applied to the clk terminal 807 of the first device 806, and to the clkb terminal of the second gate device 808. Hence, the first and second gate devices 806, 808 will alternate states, and accordingly the electrical conduction between their respective input and output terminals. This provides the two-to-one multiplexing behavior described above.

Figure 6:
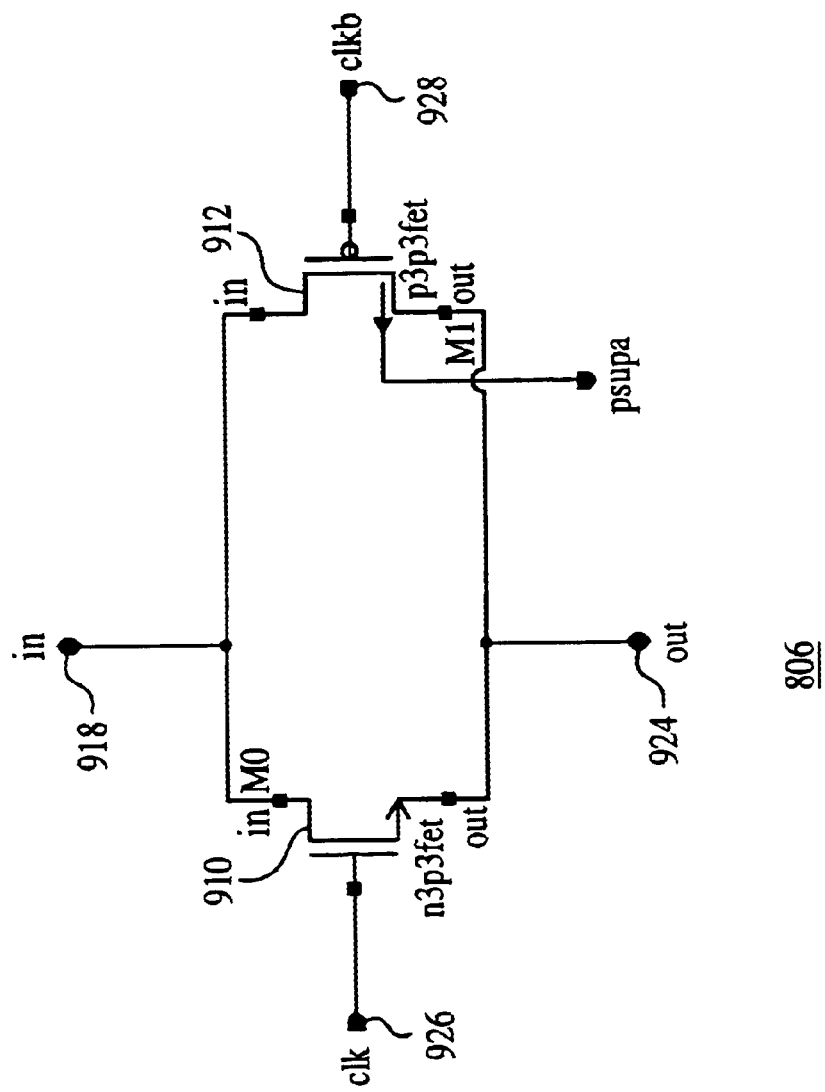
FIG. 6 is a schematic diagram illustrating one exemplary embodiment of transistor gate logic used to implement the switch limiter of FIG. 5.

FIG. 6 illustrates one exemplary embodiment of the gate devices ("TG_max") 806, 808, shown in FIG. 5. As shown in FIG. 6, the gate device 806 generally comprises a pair of MOSFETs 910, 912 arranged with their sources coupled to an input terminal 918, and their drains coupled to a common output terminal 924. A clock (clk) input 926, as well as the complement thereof, (clkb) 928, are applied to the gates of their respective transistors 910, 912. When the clk input 926 drives the first MOSFET 910 into conductance, thereby coupling the input terminal 918 to the output terminal 924, the complement signal 928 maintains the second MOSFET 912 out of the conductance region, thereby preventing coupling of the input and output terminals 918, 924 through the second MOSFET.

FIG. 7a shows the output voltage waveform ("v_dref_out") 1002 that is generated by the NOR gate 540 (FIG. 2). The output voltage is shown as a function of time. As illustrated in FIG. 7a, the output voltage waveform 1002 varies between approximately 3 volts during periods when the input waveform does not require clipping, and zero volts during periods when clipping is required. Similarly, FIG. 7b shows the output waveform ("v_din_out") 1004 of the inverter 542 (FIG. 2). The inverter 542 inverts the output waveform 1002 of the NOR gate 540 so that the aforementioned voltage values (i.e., zero and 3 volts) are reversed. The output waveform 1002 is used to enable/disable a first switch double limiter 552, while the output 1004 of the inverter 542 is used to enable/disable a second switch double limiter 554. The switch double limiters 552, 554 are described in detail below with respect to FIG. 8. When the first switch double limiter 552 is "enabled" (i.e., when the waveform 1002 v_dref_out is high), the pathway between two input signal terminals 560, 562 and output terminals 564, 566 is switched off. During this same time period, the second switch double limiter 554 is "disabled" such that the input signals 570, 572 applied to the input terminals 574, 576 thereof are passed to the respective output terminals 578, 580.

The inputs at the terminals 574, 576 are therefore passed through to the limiter circuit output terminals 582, 584, corresponding to the "unclipped" state of operation. Conversely, when the first double limiter 552 is "disabled" (i.e., when the output waveform v_dref_out 1002 is at zero volts, corresponding to a "clipped" state of operation), the clipped signals from the two switch limiters 518, 520 that are input to the respective input terminals 560, 562 of the first double limiter 552 are passed to respective ones of the output terminals 564, 566, and ultimately to the circuit output terminals 582, 584.

Figure 8:
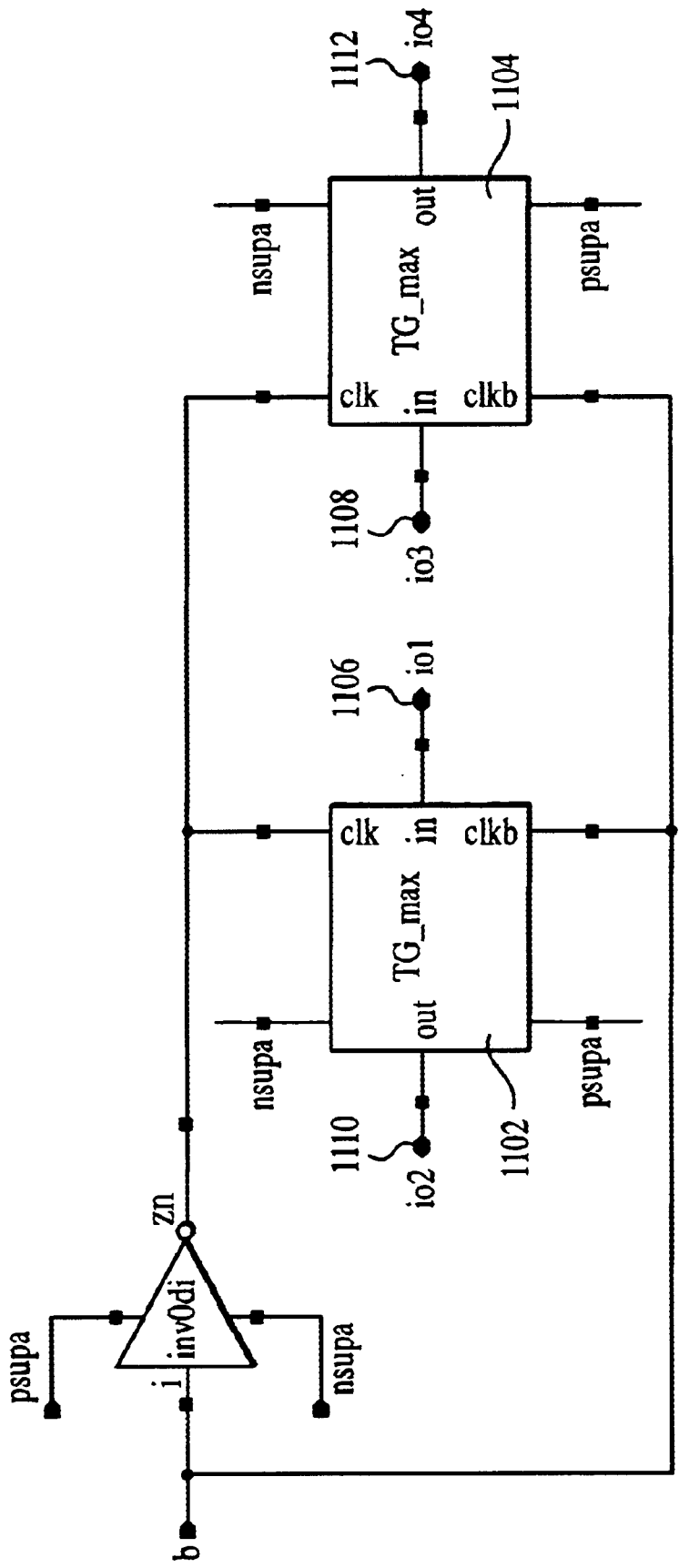
FIG. 8 is schematic diagram illustrating one exemplary embodiment of a switch double limiter device used in the signal conditioning circuit of FIG. 2.

FIG. 8 shows a schematic diagram of an exemplary embodiment of the switch double limiter devices 552, 554 described above with reference to FIG. 2. Similar to the switch limiters 518, 520 described above with reference to FIG. 5, the double limiters 552, 554 utilize FET-based transistor gate logic 1102, 1104 to control the application of input signals 1106, 1108 to respective output terminals 1110, 1112 of the double limiters 552, 554. The double-limiters control the application of the two input signals to the two output terminals 1110, 1112, in contrast to the technique of arbitrating between two inputs for output to a single output terminal as performed by the switch limiter of FIG. 5. Otherwise, the construction and operation of the double limiters (including the transistor gate logic) is analogous to that of the single limiters 518, 520 described above with reference to FIG. 5.

In the embodiment of the present limiter invention shown in FIG. 2, both the FET-based switch limiters 518, 520 and the switch double limiters 552, 554 are chosen to provide very low switch delay, thereby making the transition between the clipped and unclipped states of operation as rapid and as "sharp" as possible. A sharp transition advantageously minimizes signal distortion within the usable range of the input signal. It will be recognized, however, that other types of devices providing such a sharp transition, whether employing transistors for switching or otherwise, may be substituted without departing from the spirit or scope of the present invention.

The bias limiter block 590 shown in FIG. 2 provides currents to each of the comparators 510, 512, clipping signal buffers 514, 516, and the input limiter amplifier 502 during circuit operation. Note, however, that other types of current sources may be used with equal success. For example, in one embodiment, a plurality of additional current sources may be switched into or out of the circuit using a switched current source configuration. Alternatively, a switched-circuit can be used to re-configure existing current sources. As described above with reference to the description of the operational amplifiers 514, 516 of FIG. 2, current is reduced to some limiter components when the limiter 500 is in a non-clipping mode of operation. The bias_limiter block 590 outputs a minimal operating current to the operational amplifiers 514, 516 when the input signal falls within the threshold voltages. However, when the input signal meets or exceeds the threshold voltages, the bias_limiter 590 increases the current supplied to the operational amplifiers 514, 516. This feature of the present invention reduces the power consumed during periods when the input signal does not require conditioning (i.e., during "non-clipping" modes of operation).

Method of Conditioning an Analog Signal

Figure 9:
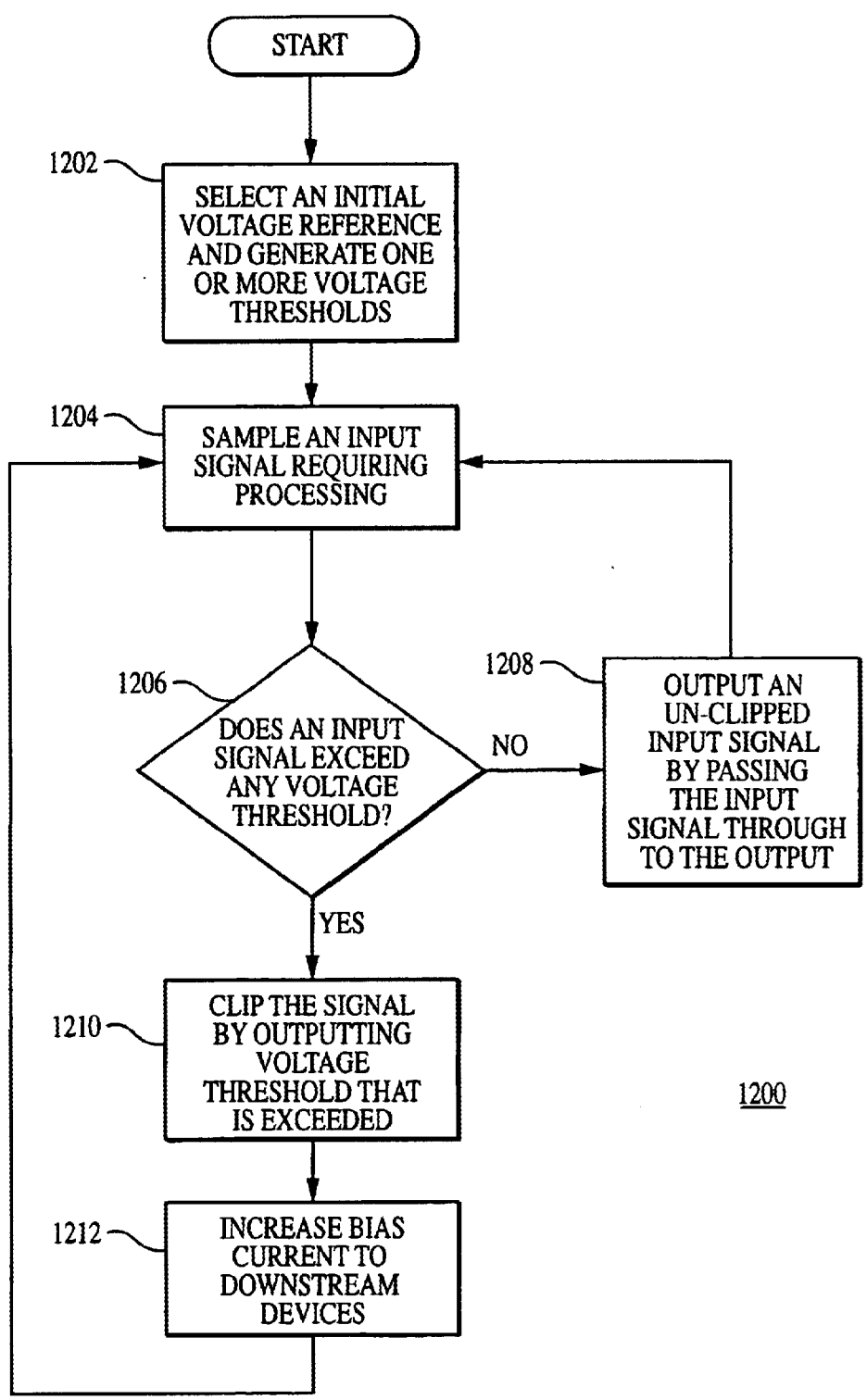
FIG. 9 is a logical flow diagram illustrating one embodiment of the method of conditioning an analog signal in accordance with the present invention.

Referring now to FIG. 9, a method of conditioning an analog signal according to the present invention is now described. As shown in FIG. 9, the conditioning method begins at a first STEP 1202 whereat an initial voltage reference is selected. In the illustrated embodiment, one or more desired voltage thresholds are derived from the initial voltage reference for use in conditioning the input signal. In one embodiment of the present invention wherein the method is used in conjunction with higher-order delta-sigma ADCs, two voltage thresholds (i.e., an "upper" or high limit, and a "lower" or low limit threshold) are specified at the STEP 1202. However, it shall be appreciated by those skilled in the electronics arts that certain applications may require specification of a greater or lesser number of discrete voltage threshold values. The present invention contemplates use of multiple or single voltage threshold values. Moreover, such thresholds may vary as a function of time or some other parameter of interest, such as a reference voltage value.

The method 1200 then proceeds to a STEP 1204 whereat the input signal is sampled or otherwise provided. The input signal is typically a time-variant analog input signal such as that shown in FIG. 3b described above. For the sake of simplicity, this input signal is considered to be a perfect sinusoid of the type well known in the art, although it will be readily appreciated that the signal may comprise any simple or complex waveform whose voltage varies with time. The input signal may be derived from any number of well-understood signal sources, such as for example the tuner circuit of an NTSC FM decoder. In the present embodiment, the input signal is chosen to be a differential signal (e.g., "vip1 minus vin1"), although other signal arrangements may be used without departing from the scope or spirit of the present invention.

At a comparison STEP 1206, one side of the differential input signal is monitored and compared to the two aforementioned thresholds. In the embodiment of the method shown in FIG. 9, only one component, either positive or negative, of the differential input signal is examined. In this embodiment, the input is assumed to be differential. It shall be appreciated, however, that both positive and negative components may be monitored, as in the case of a non-differential input signal.

As a result of the forgoing comparison at the STEP 1206, either a true (logical "high") or false (logical "low") condition will be established. In the case where either of the high or low voltage threshold values are exceeded by the input signal, the comparators 510, 512 of FIG. 2 (and the comparators 106, 108 of FIG. 1) output a true (logical "high") output signal. The clipping portion 501 of the limiter circuit 500 (and the clipping portion 101 of the limiter circuit 100 of FIG. 1) is thereby activated. The activation of the clipping portion is shown in the methods of FIG. 9 when it is determined at the STEP 1206 that the input signal exceeds one of the specified voltage thresholds and the method proceeds to a STEP 1210 whereat the input signal is clipped.

In accordance with the present invention, and as described above with reference to FIGS. 1 and 2, the input signal is clipped by outputting only the voltage threshold that is determined to be exceeded at the comparison STEP 1206. For example, only the upper voltage threshold "v_2ref_high" is output by the limiter circuit 500 at the STEP 1210 when the upper voltage threshold is exceeded by the input signal (i.e., when the input signal rises above the upper limit). Similarly, only the lower voltage threshold "v_2ref_low" is output by the limiter circuit 500 at the STEP 1210 when the lower voltage threshold is exceeded by the input signal (i.e., when the input signal falls below the lower limit). The limiter output is provided as input to an ADC or other downstream device. As shown in FIG. 9, the method then proceeds to a STEP 1212 whereat the bias currents of the ADC or other downstream devices are automatically increased when the clipping portion of the limiter circuit is activated. The method 1200 then returns to the monitoring STEP 1204 to continue monitoring the input signal.

Should the input signal be determined not to exceed the voltage thresholds (at the STEP 1206), the clipping portion of the limiter is turned off at a STEP 1208. The clipping portion of the present limiter is turned off as soon as the input signal falls below the relevant threshold voltage. Therefore, as indicated in FIG. 9, the present method outputs an unclipped signal by simply allowing the input signal to pass through to the limiter output terminals. As described above with reference to FIG. 2, this is accomplished by "disabling" the second switch double limiter 554 and allowing the inputs 570, 572 to pass through to the output terminals 582, 584.

Integrated Circuit and Related Devices Using the Present Invention

Figure 10A:
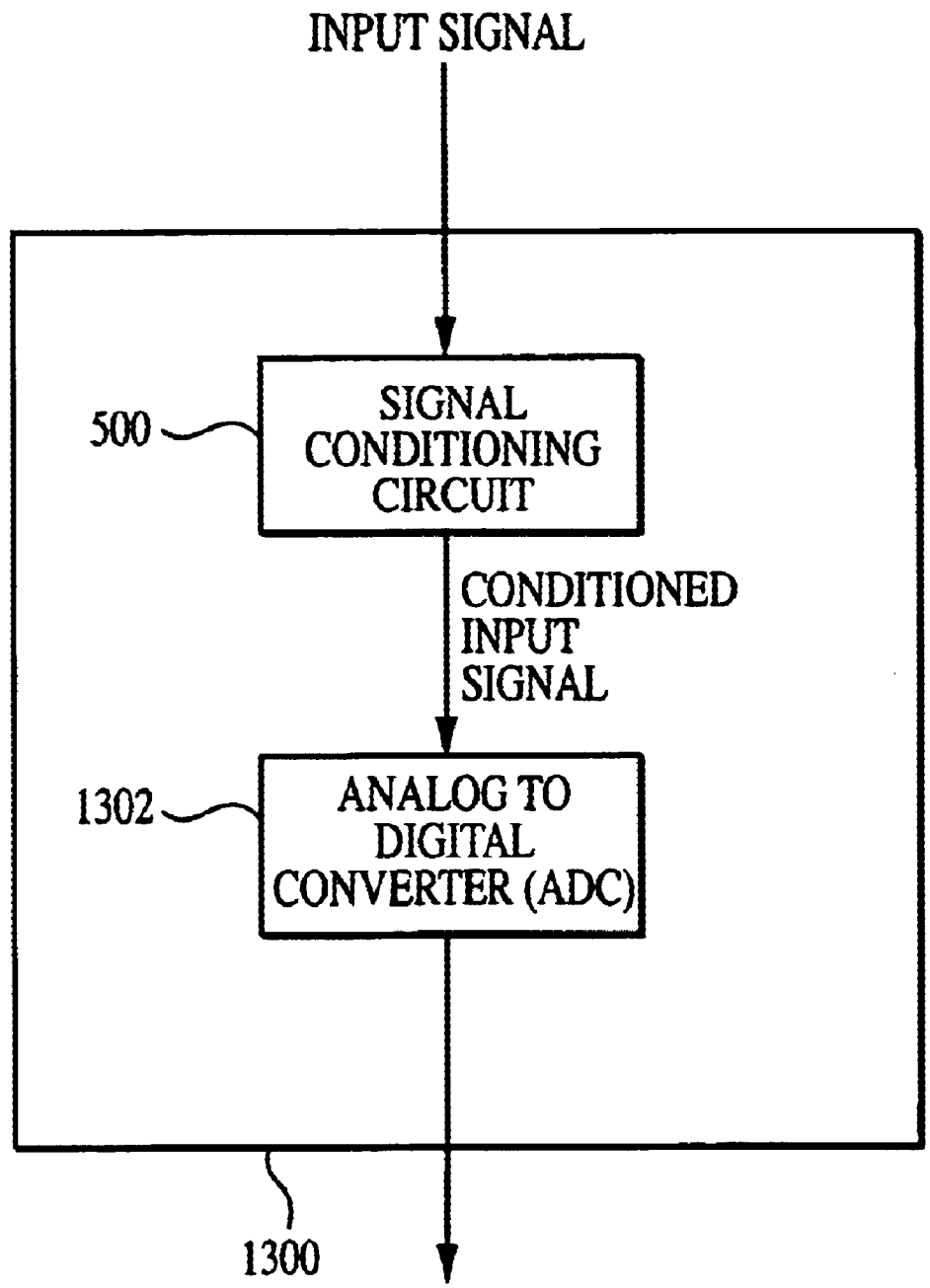
FIG. 10a is a simplified block diagram of a first exemplary embodiment of an integrated circuit device incorporating the signal conditioning apparatus of the present invention.

Referring now to FIG. 10*a*, a first exemplary embodiment of an integrated circuit device 1300 incorporating the signal conditioning apparatus of the present invention is shown. In one embodiment, the integrated circuit 1300 is an ASIC comprising the signal conditioning circuit 500 of FIG. 2 and a third-order ADC 1302. As shown in FIG. 10*a*, the ADC 1302 receives a conditioned input signal from the output of the signal conditioning circuit 500 of the present invention. In another embodiment of the IC 1300, the signal conditioning circuit 100 described above with reference to FIG. 1 is used to condition an input signal before it is input to the ADC 1302. In one embodiment, the IC 1300 is fabricated in the form of a silicon die contained within a dual in-line package configuration of the type well known in the electrical arts, although it will be recognized that other types of packaging/terminal arrangements (including PGA, BGA, micro-BGA, or even "flip-chip" or tape automated bonding) may be used without departing from the scope or the spirit of the present invention.

Figure 10B:
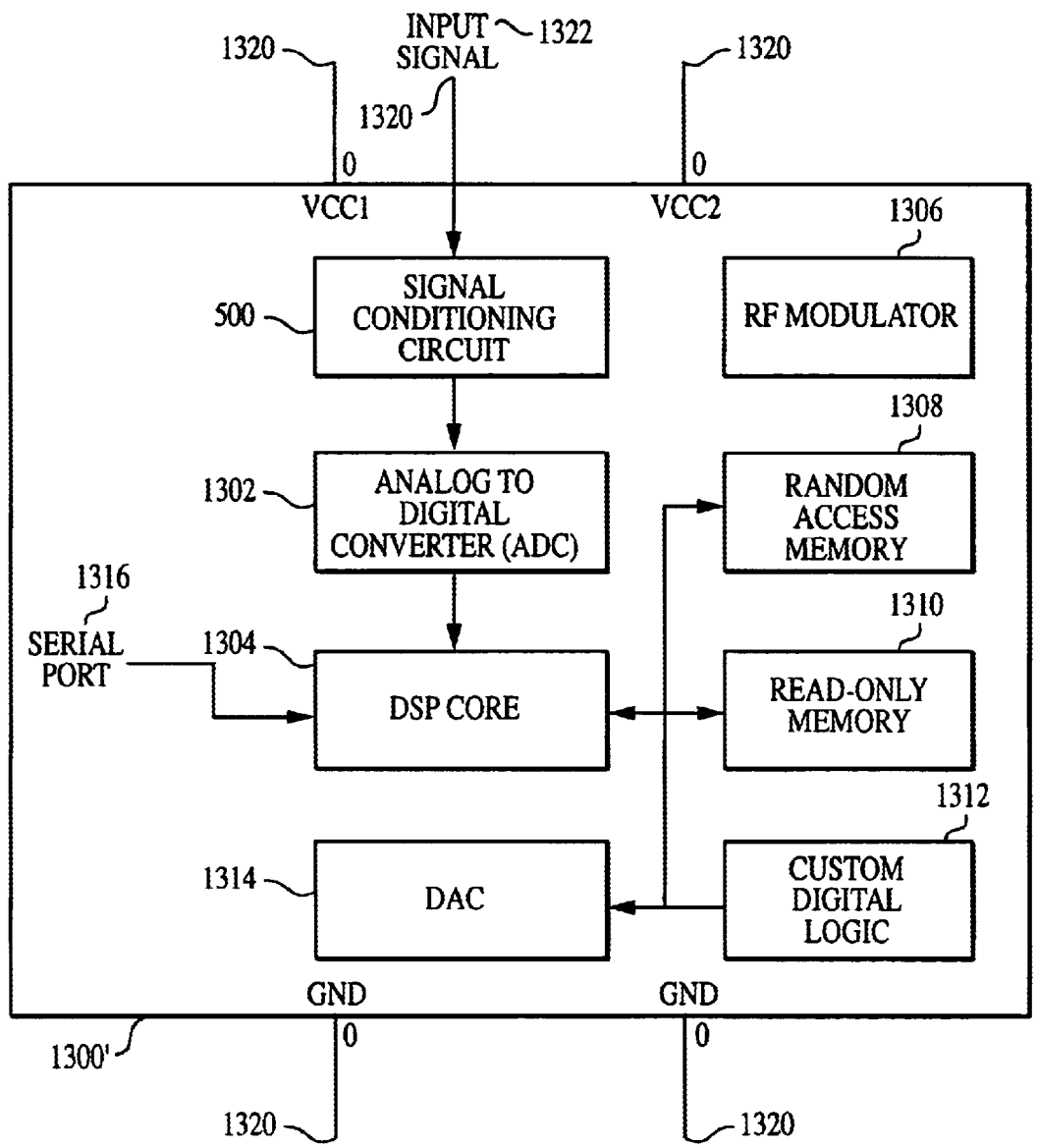
FIG. 10b is a block diagram of second exemplary embodiment of an integrated circuit device incorporating the signal conditioning apparatus of the present invention.

FIG. 10*b* illustrates a second exemplary embodiment of an integrated circuit ("IC") device incorporating the signal conditioning apparatus of the present invention. As shown in FIG. 10*b*, the exemplary embodiment of the IC comprises a "system on a chip" (SoC) digital signal processing (DSP) device 1300' of the type generally well known in the electrical arts. The DSP device 1300' includes the signal conditioning circuit 500 of FIG. 2, a third-order delta-sigma ADC 1302, a DSP core 1304, an RF modulator 1306, a random access memory 1308, a read-only memory 1310, a custom digital logic block 1312, a digital-to-analog converter (DAC) 1314, and serial port 1316. In one embodiment, the device 1300' is packaged in the well known "flat pack" (FP) configuration with a plurality of pins 1320 arranged around the periphery of the die. As shown in FIG. 10*b*, an analog input signal 1322 is input to one or more of the pins 1320 of the package. The analog input signal 1322 is thereby electrically coupled to the input node(s) of the signal conditioning circuit 500. The output of the signal conditioning circuit 500 is input to the delta-sigma ADC 1302, which then converts the conditioned analog signal into a digital representation for subsequent processing by the DSP core 1304. The design, electrical interconnection, and operation of the remaining components of the device 1300' are well known in the semiconductor arts, and accordingly are not described further herein.

It will be appreciated by one skilled in the art that the IC 1300' of FIG. 10*b* may have several different configurations, and may contain any commonly available peripherals such as serial communications devices, parallel ports, microcontrollers, timers, counters, high current drivers, ADC, DAC, interrupt processors, LCD drivers, memories, DMA, or other related peripherals. Additionally, the IC 1300' may contain custom or application specific circuitry that is specially adapted to solve application-related problems or meet the needs of a certain application. The integrated circuit 1300' of the present invention is therefore not limited in the type, number, or complexity of peripherals and other circuitry that may be combined with the signal conditioning apparatus disclosed herein. For example, in one embodiment, the delta-sigma ADC that uses the present limiter invention can be used in an application that decodes BTSC MTS spectrum audio signals in an NTSC FM carrier. The ADC might be used to decode an audio program transmitted as part of an audio/video broadcast program. Alternatively, the ADC could be used to decode a baseband audio program in a transmitted signal that has distinct frequencies allocated for the transmission of various audio signals (such as, for example, SAP, stereo, etc., audio signals).

Figure 11:
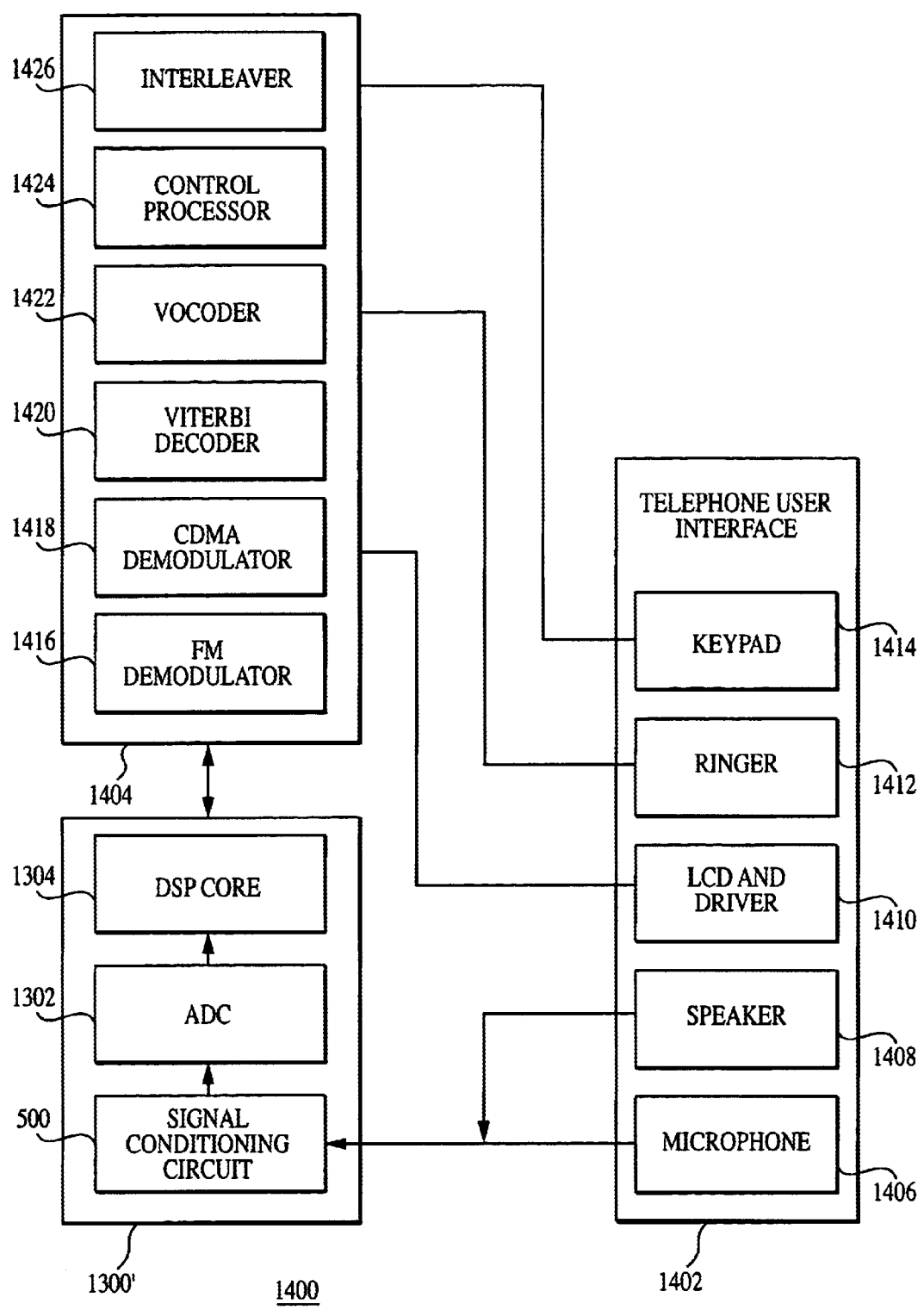
FIG. 11 shows a simplified block diagram of a mobile wireless digital telephone incorporating the present inventive signal conditioning apparatus.

FIG. 11 shows a simplified block diagram of one exemplary embodiment of an electronic device incorporating the present inventive signal conditioning apparatus. As shown in the block diagram of FIG. 11, the electronic device 1400 comprises a mobile wireless digital telephone (such as an IS-95A-complaint CDMA telephone). The mobile telephone 1400 of FIG. 11 utilizes the DSP device 1300' described above with reference to FIG. 10*b* for, inter alia, analog voice processing. The mobile wireless telephone 1400 includes a user interface block 1402, a modem block 1404, and the IC 1300' described above with reference to FIG. 10*b*. The modem block 1404 may include an FM demodulator 1416, a CDMA demodulator 1418, a Viterbi decoder 1420, a voice coder (or "Vocoder") 1422, a control processor 1424 and an interleavor 1426. The functions and operations of the modem block are well known in the telecommunications art and therefore are not described in more detail herein. As shall be appreciated by those skilled in the telecommunications arts, the configuration of the modem block can be modified to meet the needs of a particular mobile telephone application. Some blocks may be added, removed, or replaced, depending upon the exact specifications of the mobile telephone. Moreover, this block may comprise an ASIC specifically designed to meet the requirements of the wireless telephone 1400.

The user interface allows the user of the wireless telephone 1400 to use and gain access to all of the features provided by the telephone. As shown in FIG. 11, the user interface typically includes a microphone 1406, a speaker 1408, a display (typically a liquid crystal display) 1410, a ringer 1412, and a keypad 1414. The operations and functions of the user interface block 1402 are well known in the telecommunications art and therefore are not described in more detail herein. The microphone 1406 generates a time-variant analog signal based upon the voice input of the user. As shown in FIG. 11, the analog signal is input to the signal conditioning circuit 500 of the DSP 1300' to selectively condition or "clip" the analog signal before it is provided as input to the delta-sigma ADC 1302 as described above.

While a digital wireless telephone has been selected as one exemplary embodiment of an electronic device that incorporates the present inventive signal conditioning apparatus, it will be appreciated by those skilled in the electronics design art that the present analog signal conditioning apparatus (whether in the form of an IC such as that of FIG. 10*a*, or otherwise) may be used in conjunction with any number of different types of electronic devices and applications. For example, the present inventive signal conditioning apparatus may be used in conjunction with a delta-sigma ADC to facilitate the decoding of BTSC MTS spectrum audio signals in NTSC FM carriers. In fact, the present inventive signal conditioning apparatus can be used in any device that uses a third, or higher order delta-sigma ADC. In addition, the present invention may be used in conjunction with other electronic devices such as voice Coder/Decoders (Codecs) or other devices that process voice information before it is output to a speaker or similar output device.

Furthermore, the present inventive signal conditioning apparatus may be used in conjunction with consumer electronic devices such as televisions, personal computing devices, wireless personal digital assistants ("PDAs"), Internet-based appliances, set-top boxes ("STBs"), cable modems, informational players similar in operation to video-cassette recorders (VCRs) and DVD players, satellite receivers, and wireless DSL devices. The present invention contemplates use in electronic devices where signal conditioning of an analog signal prior to downstream digital signal processing is an important design consideration.

It will be recognized by those skilled in the electronics arts that while certain aspects of the invention are described in terms of the foregoing sequence of steps of a method, this description is only illustrative of the broader methods of the invention, and may be modified as required by the particular application. Certain steps may be rendered unnecessary or optional under certain circumstances. Additionally, certain steps or functionality may be added to the disclosed embodiments, or the order of performance of two or more steps permuted. All such variations are considered as being encompassed within the invention disclosed and claimed herein.

SUMMARY

In summary, a method and apparatus for conditioning an analog signal for further downstream digital processing has been described. The method and apparatus advantageously avoids the introduction of signal distortion, noise, and time delays associated the prior art signal conditioning techniques. The method and apparatus compares the input signal to one or more threshold voltages, and allows the analog input signal to pass undisturbed if the input signal fails to exceed the threshold voltages. However, should the input signal equal or exceed any of the threshold voltages, the present invention limits the output signal to the exceeded threshold voltage. Power is conserved by limiting current to some components until signal conditioning is required.

A number of embodiments of the present invention have been described. Nevertheless, it will be understood that various modifications may be made without departing from the spirit and scope of the present invention. For example, although the invention has been described above in terms of an apparatus and method for conditioning an analog signal for input to an analog-to-digital converter (ADC), the invention may be utilized equally as well in other applications where clipping and other means for conditioning an analog input signal are desired. All such other applications of the invention are considered to fall within the scope of the claims appended hereto. Accordingly, it is to be understood that the invention is not to be limited by the specific illustrated embodiment, but only by the scope of the appended claims.

What is claimed is:

1. A signal conditioning circuit comprising:
    an input node that receives an input voltage signal;
    an output node;
    threshold voltage generator means for generating an upper threshold voltage and a lower threshold voltage;
    clipping circuit means for coupling either the upper threshold voltage or the lower threshold voltage to the output node;
    non-clipping circuit means for coupling the input voltage signal to the output node; and
    comparator means for comparing the input voltage signal and the upper and lower threshold voltages and generating a comparator output; and
    switching means for enabling either the clipping circuit means or the non-clipping circuit means in response to the comparator output.

2. A signal conditioning circuit as claimed in claim 1 wherein:
    the clipping circuit means comprises buffers that receive the upper threshold voltage and the lower threshold voltage as inputs and that, when enabled by the switching means, are coupled to and output either the upper threshold voltage or the lower threshold voltage to the output node;
    the non-clipping circuit means comprise pass-through buffers that receive the input voltage signal as inputs and that, when enabled by the switching means, are coupled to and pass the input voltage signal to the output node.

3. A signal conditioning circuit as claimed in claim 2 wherein:
    the comparator means comprises a first comparator that compares the input voltage signal to the upper threshold voltage and generates a first comparator output, and a second comparator that compares the input voltage signal to the lower threshold voltage and generates a second comparator output; and
    the switching means comprises a logic circuit that inputs the first and second comparator outputs and has an output coupled to the clipping and non-clipping circuit means.

4. A signal conditioning circuit as claimed in claim 3, wherein the logic circuit comprises a NOR gate.

5. A signal conditioning circuit as claimed in claim 4, wherein:
    the first comparator generates a logical low signal if the input voltage signal is less than the upper threshold voltage, and generates a logical high signal if the input voltage signal equals or exceeds the upper threshold voltage;

the second comparator generates a logical low signal if the input voltage signal is greater than the lower threshold voltage, and generates a logical high signal if the input voltage signal equals or is less than the lower threshold voltage;

the NOR gate outputs a logical low signal if either the first or second comparator output is a logical high, the NOR gate output disabling the pass-through buffers of the non-clipping circuit means and enabling the buffers of the clipping circuit means; and the NOR gate outputs a logical high signal if both of the first and second comparator outputs is a logical low, the NOR gate output enabling the pass-through buffers of the non-clipping circuit means and disabling the buffers of the clipping circuit means.

6. A signal conditioning circuit as claimed in claim 1, wherein:

the clipping circuit means comprises switch limiter means that receives the upper and lower threshold voltages as inputs and that, when enabled, couples either the upper threshold voltage or the lower threshold voltage to the output node;

the non-clipping circuit means comprises switch limiter means that receive the input voltage signal as an input and that, when enabled, couples the input voltage signal to the output node.

7. A signal conditioning circuit as claimed in claim 6 wherein the clipping and non-clipping switch limiter means comprise MOSFET transistors to facilitate a rapid transition between the clipping and non-clipping circuit means.

8. A signal conditioning circuit as claimed in claim 7, wherein:

the comparator means comprises a first comparator that compares the input voltage signal to the upper threshold voltage and generates a first comparator output, and a second comparator that compares the input voltage signal to the lower threshold voltage and generates a second comparator output; and the clipping switch limiter means comprises:
 a first switch limiter that is coupled to and outputs the high threshold voltage when enabled by the first comparator;
 a second switch limiter that is coupled to and outputs the low threshold voltage when enabled by the second comparator; and
 a double switch limiter that is coupled to the outputs of the first and second switch limiter and outputs either the high threshold voltage or the low threshold voltage to the output node when enabled by the switching means.

9. A signal conditioning circuit as claimed in claim 6 and further comprising a bias limiter block that reduces bias current levels provided to components of the clipping circuit means when the clipping circuit means is not operative.

10. A signal conditioning circuit as claimed in claim 1, wherein the input voltage signal is a differential signal pair.

11. An integrated circuit comprising said signal conditioning circuit as claimed in claim 1, and an analog-to-digital converter coupled to the output node of the signal conditioning circuit.

12. A digital signal processor comprising said integrated circuit as claimed in claim 11.

13. A wireless telephone comprising said digital signal processor as claimed in claim 11.

14. A signal conditioning circuit comprising:
an input node that receives an input voltage signal;
an output node;
a threshold voltage generator that generates an upper threshold voltage and a lower threshold voltage;
a selectively-enabled clipping circuit comprising tri-state buffers that, when enabled, couples either the upper threshold voltage or the lower threshold voltage to the output node, the bias power supply to the buffers being reduced to a minimum when the clipping circuit is not enabled;
a selectively-enabled non-clipping circuit comprising pass-through buffers that, when enabled, couples the input voltage signal to the output node; and
a first comparator that compares the input voltage signal to the upper threshold voltage and generates a first comparator output;
a second comparator that compares the input voltage signal to the lower threshold voltage and generates a second comparator output; and
switching logic that inputs the first and second comparator outputs and generates an output operative to enable either the clipping circuit or the non-clipping circuit based on the first and second comparator outputs.

15. A signal conditioning circuit comprising:
an input node that receives an input voltage signal;
an output node;
a threshold voltage generator that generates an upper threshold voltage and a lower threshold voltage;
a selectively-enabled clipping circuit comprising MOSFET transistor-based switch limiters that, when enabled, couples either the upper threshold voltage or the lower threshold voltage to the output node, the bias power supply to the buffers being reduced to a minimum when the clipping circuit is not enabled;
a selectively-enabled non-clipping circuit comprising MOSFET transistor-based switch limiters that, when enabled, couples the input voltage signal to the output node; and
a first comparator that compares the input voltage signal to the upper threshold voltage and generates a first comparator output;
a second comparator that compares the input voltage signal to the lower threshold voltage and generates a second comparator output; and
switching logic that inputs the first and second comparator outputs and generates an output operative to enable either the clipping circuit or the non-clipping circuit based on the first and second comparator outputs.

16. A method for conditioning an analog signal comprising:
receiving an input voltage signal;
determining whether the input voltage signal is within a threshold voltage range defined by an upper threshold voltage and a lower threshold voltage;
when the input voltage signal is not within the threshold voltage range, enabling a clipping circuit that outputs either the upper threshold voltage or the lower threshold voltage; and
when the input voltage signal is within the threshold voltage range, disabling the clipping circuit and reducing power supplied to components of the clipping circuit, and enabling a non-clipping circuit that outputs the input voltage signal.

* * * * *